US012770664B2

(12) United States Patent
Kim et al.

(10) Patent No.: US 12,770,664 B2
(45) Date of Patent: Oct. 20, 2026

(54) SEMICONDUCTOR MEMORY APPARATUS AND AN OPERATING METHOD OF THE SEMICONDUCTOR MEMORY APPARATUS

(71) Applicant: SK hynix Inc., Icheon-si (KR)

(72) Inventors: Dong Kyu Kim, Icheon-si (KR); Ho Seok Em, Icheon-si (KR); Hyung Sik Won, Icheon-si (KR); Jeong Jun Lee, Icheon-si (KR); Jun Ho Cheon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 103 days.

(21) Appl. No.: 18/812,600

(22) Filed: Aug. 22, 2024

(65) Prior Publication Data

US 2025/0252984 A1 Aug. 7, 2025

(30) Foreign Application Priority Data

Feb. 6, 2024 (KR) ........................ 10-2024-0018352

(51) Int. Cl.
*G11C 7/12* (2006.01)
*G11C 7/06* (2006.01)
*G11C 8/08* (2006.01)

(52) U.S. Cl.
CPC .................. *G11C 7/12* (2013.01); *G11C 7/06* (2013.01); *G11C 8/08* (2013.01)

(58) Field of Classification Search
CPC ................ G11C 7/12; G11C 7/06; G11C 8/08
USPC .................................................... 365/45, 205
See application file for complete search history.

(56) References Cited

U.S. PATENT DOCUMENTS

| | | | | |
|---|---|---|---|---|
| 6,141,264 A * | 10/2000 | Casper | G11C 11/4091 365/207 |
| 7,113,004 B2 * | 9/2006 | Terzioglu | G11C 7/06 327/51 |
| 9,542,995 B2 * | 1/2017 | Sachdev | G11C 11/419 |
| 10,943,647 B1 * | 3/2021 | Fredeman | G11C 8/08 |
| 11,380,387 B1 | 7/2022 | He et al. | |
| 11,386,948 B1 | 7/2022 | He et al. | |
| 11,450,359 B1 * | 9/2022 | Chen | G11C 7/1009 |
| 2016/0372162 A1 * | 12/2016 | Choi | G11C 7/062 |
| 2017/0155382 A1 * | 6/2017 | Lee | G11C 11/4094 |
| 2017/0365308 A1 * | 12/2017 | Cha | G11C 7/22 |
| 2019/0295656 A1 * | 9/2019 | Clinton | G11C 7/18 |
| 2020/0075089 A1 * | 3/2020 | Hong | G11C 11/418 |

(Continued)

FOREIGN PATENT DOCUMENTS

| | | |
|---|---|---|
| JP | 2000030455 A * | 1/2000 |
| JP | 2011040161 A * | 2/2011 |

(Continued)

*Primary Examiner* — Michael T Tran
(74) *Attorney, Agent, or Firm* — WILLIAM PARK AND ASSOCIATES LTD.

(57) ABSTRACT

A semiconductor memory apparatus is configured to perform a mismatch compensation operation of a bitline sense amplifier and enable a wordline electrically coupled with a bitline, after electrically isolating an input node of the bitline sense amplifier and the bitline. When the mismatch compensation operation of the bitline sense amplifier is completed, the semiconductor memory apparatus is configured to electrically couple the bitline and the input node of the bitline sense amplifier to develop a voltage level difference between the bitline and a bitline bar.

19 Claims, 11 Drawing Sheets

(56) References Cited

U.S. PATENT DOCUMENTS

| | | | | |
|---|---|---|---|---|
| 2020/0227111 | A1* | 7/2020 | Kim | G11C 7/02 |
| 2022/0020423 | A1* | 1/2022 | Moon | G11C 11/4091 |
| 2023/0337418 | A1* | 10/2023 | Lee | H10B 12/50 |

FOREIGN PATENT DOCUMENTS

| | | | | | |
|---|---|---|---|---|---|
| JP | 2011090778 | A | * | 5/2011 | |
| KR | 1020140028356 | A | | 3/2014 | |
| KR | 20150015809 | A | * | 2/2015 | G11C 7/065 |
| KR | 1020200024555 | A | | 3/2020 | |

* cited by examiner

SEMICONDUCTOR MEMORY APPARATUS AND AN OPERATING METHOD OF THE SEMICONDUCTOR MEMORY APPARATUS

CROSS-REFERENCES TO RELATED APPLICATION

The present application claims priority under 35 U.S.C. § 119(a) to Korean patent application number 10-2024-0018352 filed on Feb. 6, 2024, in the Korean Intellectual Property Office, which application is incorporated herein by reference in its entirety.

BACKGROUND

1. Technical Field

Various embodiments generally relate to integrated circuit technology, and more particularly, to a semiconductor memory apparatus and an operating method of the semiconductor memory apparatus.

2. Related Art

A semiconductor memory apparatus may include a memory cell array and a bitline sense amplifier. The memory cell array may include a plurality of bitlines and a plurality of wordlines, connected to a plurality of memory cells. The semiconductor memory apparatus may enable a wordline based on a row-series command address signal and select a bitline pair based on a column-series command address signal. The bitline sense amplifier may sense and amplify voltage levels of the bitline pair (i.e., bitline and bitline bar) to read data stored in a memory cell associated with the wordline and the bitline, or to write data to the memory cell.

The bitline sense amplifier may include a plurality of transistors. Process skew and PVT (Process, Voltage, Temperature) variations of MOS (metal oxide semiconductor) transistors are increasing as the size of semiconductor apparatus is integrated and miniaturized, and process skew is inevitably present even between MOS transistors manufactured simultaneously on the same wafer and in the same environment. Process skew or offset between MOS transistors can significantly reduce the operational reliability of semiconductor apparatus. In particular, mismatches such as threshold voltage differences between transistors that make up a bitline sense amplifier, which must detect and amplify small voltage level difference, can be an important factor in determining whether a semiconductor apparatus is good or bad. Accordingly, operations may be performed to compensate for the mismatch between the transistors that make up the bitline sense amplifier before the bitline sense amplifier senses and amplifies the voltage levels of the bitline pair. However, by performing the mismatch compensation operation, the timing at which the wordline is enabled and the timing at which the bitline sense amplifier amplifies the voltage levels of the bitline pair may be delayed, and timing specifications such as tRCD (RAS (row address strobe) to CAS (column address strobe) delay time) may be degraded, thereby reducing the performance of the semiconductor memory apparatus.

SUMMARY

In an embodiment, a semiconductor memory apparatus may include a sub-wordline driver, a bitline sense amplifier, and a bitline switching circuit. The sub-wordline driver may be configured to enable a wordline electrically coupled with a bitline based on a wordline control signal, and may be configured to delay the wordline control signal to generate a bitline switching signal. The bitline sense amplifier may be configured to amplify and latch signals received through a first input node and a second input node. The bitline switching circuit may be configured to electrically couple the bitline with the first input node and a bitline bar with the second input node, in response to the bitline switching signal.

In an embodiment, an operating method of a semiconductor memory apparatus may include electrically isolating a bitline from a first input node of a bitline sense amplifier, and electrically isolating a bitline bar from a second input node of the bitline sense amplifier; performing a mismatch compensation operation of the bitline sense amplifier, and enabling a wordline to electrically couple a memory cell and the bitline; electrically coupling the first input node with the bitline, and electrically coupling the second input node with the bitline bar; and developing a voltage level difference of a first node and a second node by amplifying voltage levels between the first and second input nodes.

In an embodiment, a semiconductor memory apparatus may include a sub-wordline driver, a bitline sense amplifier, and a bitline switching circuit. The sub-wordline driver may be configured to enable one of a first wordline electrically coupled with a first bitline and a second wordline electrically coupled with a second bitline based on a wordline control signal, and may be configured to delay the wordline control signal to generate one of a first bitline switching signal and a second bitline switching signal. The bitline sense amplifier may be configured to amplify and latch voltage levels of a global bitline and a global bitline bar. The bitline switching circuit may be configured to electrically couple the first bitline and a first bitline bar with the global bitline and the global bitline bar, respectively, in response to the first bitline switching signal, and may be configured to electrically couple the second bitline and a second bitline bar with the global bitline and the global bitline bar, respectively, in response to the second bitline switching signal.

In an embodiment, an operating method of a semiconductor memory apparatus may include electrically isolating first and second bitlines from a global bitline and electrically isolating first and second bitline bars from a global bitline bar; performing a mismatch compensation operation of a bitline sense amplifier; enabling one of first and second wordlines to electrically couple one of the first and second bitlines with a memory cell; electrically coupling a bitline electrically coupled with an enabled wordline between the first and second bitlines with the global bitline; and developing a voltage level difference of a first node and a second node by amplifying voltage levels between the global bitline and the global bitline bar.

DETAILED DESCRIPTION

Figure 1:
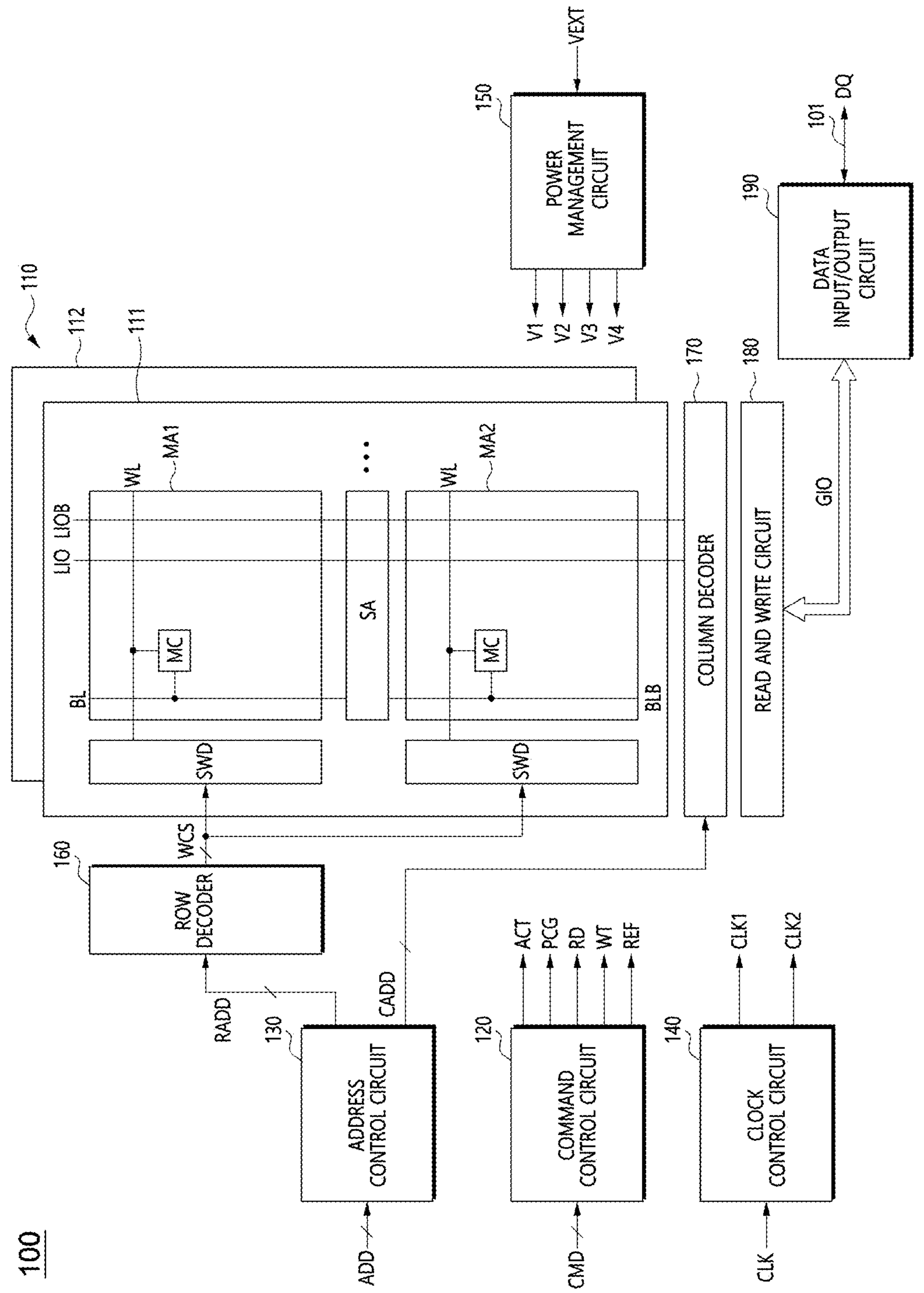
FIG. 1 is a diagram illustrating a configuration of a semiconductor memory apparatus according to an embodiment.

FIG. 1 is a diagram illustrating a configuration of a semiconductor memory apparatus 100 according to an embodiment. The semiconductor memory apparatus 100 may include a data storage region 110, a command control circuit 120, an address control circuit 130, a clock control circuit 140, a power management circuit 150, a row decoder 160, a column decoder 170, a read and write circuit 180, and a data input/output circuit 190. The data storage region 110 may include a plurality of memory cell array blocks. The plurality of memory cell array blocks may include a plurality of memory cells capable of storing data. For example, the plurality of memory cell array blocks may include a first memory cell array block 111 and a second memory cell array block 112. In FIG. 1, the number of memory cell array blocks included in the data storage region 110 is illustrated as two, but the number of memory cell array blocks included in the data storage region 110 may be four, eight, or more. The first and second memory cell array blocks 111, 112 may each include a plurality of unit cell array blocks. For example, the first memory cell array block 111 may include a first unit cell array MA1 and a second unit cell array MA2. The unit cell array may be a memory tile or a memory cell mat. The first and second unit cell arrays MA1, MA2 may each include a plurality of wordlines WL and a plurality of bitlines BL, BLB, and a plurality of memory cells MC may be electrically coupled at points where the plurality of wordlines WL and the plurality of bitlines BL, BLB intersect, respectively. A bitline sense amplifier array SA may be disposed between the first and second unit cell arrays MA1, MA2. The bitline sense amplifier array SA may include a plurality of bitline sense amplifiers, and the number of the bitline sense amplifiers may change depending on the number of bitlines disposed in the first and second unit cell arrays MA1, MA2. The bitline sense amplifier provided in the bitline sense amplifier array SA may be electrically coupled with the bitline BL and bitline bar BLB to amplify and latch the voltage levels of the bitline pair BL, BLB. On the sides of the first and second unit cell arrays MA1, MA2, sub-wordline drivers SWD may be disposed. The sub-wordline driver SWD may enable a specific wordline of the plurality of wordlines WL based on a wordline control signal WCS provided from the row decoder 160 which will be described later. The first and second unit cell arrays MA1, MA2 may be disposed with local input/output line LIO and local input/output line bar LIOB. The local input/output line pair LIO, LIOB may be electrically coupled with the bitline pair BL, BLB, respectively, by the column decoder 170 which will be described later. In an embodiment, a sub-wordline driver may be implemented in hardware, software, or a combination thereof. For example, the sub-wordline driver may be realized as a sub-wordline driver circuit operating in accordance with an algorithm.

The command control circuit 120 may receive a command signal CMD, and may decode the command signal CMD to generate an internal command signal. The internal command signal may include an active signal ACT, a read signal RD, a write signal WT, and a refresh signal REF. The command signal CMD may be a signal provided from a host device (not shown) that is electrically coupled to the semiconductor memory apparatus 100. The host device may provide the command signal CMD to the semiconductor memory apparatus 100 to enable the semiconductor memory apparatus 100 to perform various operations. An operation of outputting data stored in the semiconductor memory apparatus 100 to the host device may be a read operation, and an operation of storing data received from the host device into the semiconductor memory apparatus 100 may be a write operation. An operation of activating the data storage region 110 and/or the first and second memory cell array blocks 111, 112 before the semiconductor memory apparatus 100 performs the read operation and the write operation may be an active operation. An operation of the semiconductor memory apparatus 100 deactivating the data storage region 110 and/or the first and second memory cell array blocks 111, 112 may be a precharge operation. When the host device provides the command signal CMD for performing the active operation, the command control circuit 120 may decode the command signal CMD to generate the active signal ACT. When the host device provides the command signal CMD for performing the precharge operation, the command control circuit 120 may decode the command signal CMD to generate the precharge signal PCG. In an embodiment, the command control circuit 120 might not receive the command signal CMD from the host device to generate the precharge signal PCG, and may delay the active signal ACT to generate the precharge signal PCG. When the host device provides the command signal CMD for performing the read operation, the command control circuit 120 may decode the command signal CMD to generate the read signal RD. When the host device provides the command signal CMD for performing the write operation, the command control circuit 120 may decode the command signal CMD to generate the write signal WT. The semiconductor memory apparatus 100 may perform a refresh operation to retain data stored in memory cells in which the read and write operations are not performed. When the host device provides the command signal CMD for performing the refresh operation, the command control circuit 120 may decode the command signal CMD to generate the refresh signal REF. In an embodiment, the command control circuit 120 may also generate the refresh signal REF to periodically perform the refresh operation when the semiconductor memory apparatus 100 enters a low power mode, even if the command signal CMD is not received from the host device. The command control circuit 120 may provide the internal command signal to the row decoder 160, the read and write circuit 180, and the data input/output circuit 190. For example, the command control circuit 120 may provide the active signal ACT, the precharge signal PCG, and the refresh signal REF to the row decoder 160, and may provide the read signal RD and the write signal WT to the read and write circuit 180 and the data input/output circuit 190.

The address control circuit 130 may receive the address signal ADD, and may generate a row address signal RADD and a column address signal CADD based on the address signal ADD. The address signal ADD may be a signal provided to the semiconductor memory apparatus 100 from the host device. The host device may provide the address signal ADD to the semiconductor memory apparatus 100 for accessing the first and second memory cell array blocks MA1, MA2 of the semiconductor memory apparatus 100. The address control circuit 130 may latch the address signal ADD, and output the latched address signal as the row address signal RADD or the column address signal CADD. For example, the address control circuit 130 may output the address signal ADD received during the active operation of the semiconductor memory apparatus 100 as the row address signal RADD. The semiconductor memory apparatus 100 may enable wordlines of the first and second memory cell array blocks MA1, MA2 based on the row address signal RADD during the active operation. The address control circuit 130 may output the address signal ADD received in one of the read operation and the write operation of the semiconductor memory apparatus 100 as the column address signal CADD. The semiconductor memory apparatus 100 may select a bitline BL of the first and second memory cell array blocks MA1, MA2 based on the column address signal CADD during the read and write operations. When a specific wordline of the wordlines WL of the first and second memory cell array blocks MA1, MA2 is enabled, and the specific bitline of the bitlines BL of the first and second memory cell array blocks MA1, MA2 is selected, the memory cell electrically coupled between the enabled wordline and the selected bitline may be accessed.

The clock control circuit 140 may receive a clock signal CLK and may generate a plurality of internal clock signals based on the clock signal CLK. The clock signal CLK may be a signal provided to the semiconductor memory apparatus 100 from the host device. The clock control circuit 140 may buffer the clock signal CLK to generate a first internal clock signal CLK1, and may perform a delay-locking operation on the first internal clock signal CLK1 to generate a second internal clock signal CLK2. The clock control circuit 140 may include a delay-locked loop circuit capable of performing the delay-locking operation. The clock control circuit 140 may provide at least one of the first and second internal clock signals CLK1, CLK2 to internal circuits of the semiconductor memory apparatus 100 that operate in synchronization with a clock signal. For example, the clock control circuit 140 may provide the first and second internal clock signals CLK1, CLK2 to the command control circuit 120. The command control circuit 120 may latch the command signal CMD in synchronization with the first internal clock signal CLK1, and may decode the latched command signal. When the command control circuit 120 receives the command signal CMD for performing the read operation or the write operation, the command control circuit 120 may delay the decoded command signal by a time corresponding to a read latency or a write latency in synchronization with the first internal clock signal CLK1. The command control circuit 120 may output the delayed command signal as the read signal RD or the write signal WT in synchronization with the second internal clock signal CLK2. Further, the clock control circuit 140 may provide the second internal clock signal CLK2 to the read and write circuit 180 and the data input/output circuit 190.

The power management circuit 150 may receive an external voltage VEXT from a power source, and may generate a plurality of internal voltages based on the external voltage VEXT. In an embodiment, the power management circuit 150 may receive an external voltage VEXT from a power source external from the power management circuit 150. In an embodiment, the power management circuit 150 may receive an external voltage VEXT from a power source external from the semiconductor memory apparatus 100. The plurality of internal voltages may have different voltage levels. The power management circuit 150 may include a voltage generation circuit, such as a voltage distribution circuit, a voltage pumping circuit, a voltage regulator, or the like, capable of generating the plurality of internal voltages. The power management circuit 150 may distribute the plurality of internal voltages to internal circuits of the semiconductor memory apparatus 100 through a voltage mesh (not shown) disposed in the semiconductor memory apparatus 100. The plurality of internal voltages may include a first internal voltage V1, a second internal voltage V2, a third internal voltage V3, and a fourth internal voltage V4. In an embodiment, the number of internal voltages generated by the power management circuit 150 may be five or more. For example, the second internal voltage V2 may have a voltage level higher than the first internal voltage V1, the third internal voltage V3 may have a voltage level lower than the first internal voltage V1, and the fourth internal voltage V4 may have a voltage level equal to or lower than the first internal voltage V1. The first internal voltage V1 may be a base power voltage, the second internal voltage V2 may be a pumping voltage, the third internal voltage V3 may be a core voltage, and the fourth internal voltage V4 may be a peripheral voltage. The power management circuit 150 may provide the first internal voltage V1 and the third internal voltage V3 to the memory cell array blocks MA1, MA2 and the bitline sense amplifier array SA. The power management circuit 150 may provide the second internal voltage V2 to the row decoder 160. The power management circuit 150 may provide the fourth internal voltage V4 to the command control circuit 120, the address control circuit 130, the clock control circuit 140, the row decoder 160, the column decoder 170, the read and write circuit 180, and the data input/output circuit 190.

The row decoder 160 may receive the row address signal RADD. The row decoder 160 may decode the row address signal RADD to generate the wordline control signal WCS. The wordline control signal WCS may include any signal for selecting a wordline, such as a main wordline signal and a sub-wordline selection signal. The row decoder 160 may provide the wordline control signal WCS to the sub-wordline driver SWD. The sub-wordline driver SWD may enable a specific wordline from the plurality of wordlines WL based on the wordline control signal WCS. The column decoder 170 may receive the column address signal CADD. Based on the column address signal CADD, the column decoder 170 may select a bitline pair BL, BLB to be electrically coupled with the local input/output line pair LIO, LIOB. The column decoder 170 may generate a column selection signal based on the column address signal CADD. The column decoder 170 may include a column switch electrically coupling the bitline BL with the local input/output line LIO, and electrically coupling the bitline bar BLB with the local input/output line bar LIOB. The column switch may electrically couple the local input/output line pair LIO, LIOB with the bitline pair BL, BLB based on the column selection signal. The bitline pair BL, BLB may be electrically coupled with the read and write circuit 180 through the local input/output line pair LIO, LIOB.

The read and write circuit 180 may be electrically coupled to the bitline pair BL, BLB through the column decoder 170 and the local input/output line pair LIO, LIOB. The read and write circuit 180 may receive the read signal RD and the write signal WT from the command control circuit 120. The read and write circuit 180 may be electrically coupled to the data input/output circuit 190 through a global input/output (input and output) line GIO. The read and write circuit 180 may amplify data output from the first and second unit cell arrays MA1, MA2 through the bitline pair BL, BLB and the local input/output line pair LIO, LIOB based on the read signal RD during a read operation of the semiconductor memory apparatus 100, and output the amplified data to the global input/output line GIO. The read and write circuit 180 may amplify data received through the global input/output line GIO based on the write signal WT during a write operation of the semiconductor memory apparatus 100, and provide the amplified data to the first and second unit cell arrays MA1, MA2 through the local input/output line pair LIO, LIOB and the bitline pair BL, BLB. The read and write circuit 180 may receive the second internal clock signal CLK2 from the clock control circuit 140, and may transmit data to the global input/output line GIO or receive data transmitted through the global input/output line GIO, in synchronization with the second internal clock CLK2.

The data input/output circuit 190 may be electrically coupled with the global input/output line GIO and data bus 101. The data bus 101 may be a signal transmission line connecting between the host device and the semiconductor memory apparatus 100. The data input/output circuit 190 may receive the read signal RD and the write signal WT from the command control circuit 120, and may receive the second internal clock signal CLK2 from the clock control circuit 140. The data input/output circuit 190 may receive data transmitted through the global input/output line GIO based on the read signal RD during a read operation of the semiconductor memory apparatus 100, generate a data stream DQ based on the received data, and transmit the data stream DQ to the host device through the data bus 101 in synchronization with the second internal clock signal CLK2. The data input/output circuit 190 may receive the data stream DQ transmitted from the host device through the data bus 101 based on the write signal WT during a write operation of the semiconductor memory apparatus 100. The data input/output circuit 190 may generate data based on the data stream DQ in synchronization with the second internal clock signal CLK2, and transmit the data to the read and write circuit 180 through the global input/output line GIO. The data input/output circuit 190 may include a serializer/deserializer (SerDes) that serializes data transmitted through the global input/output line GIO to generate the data stream DQ, and deserializes the data stream DQ to generate data output to the global input/output line GIO.

Figure 2:
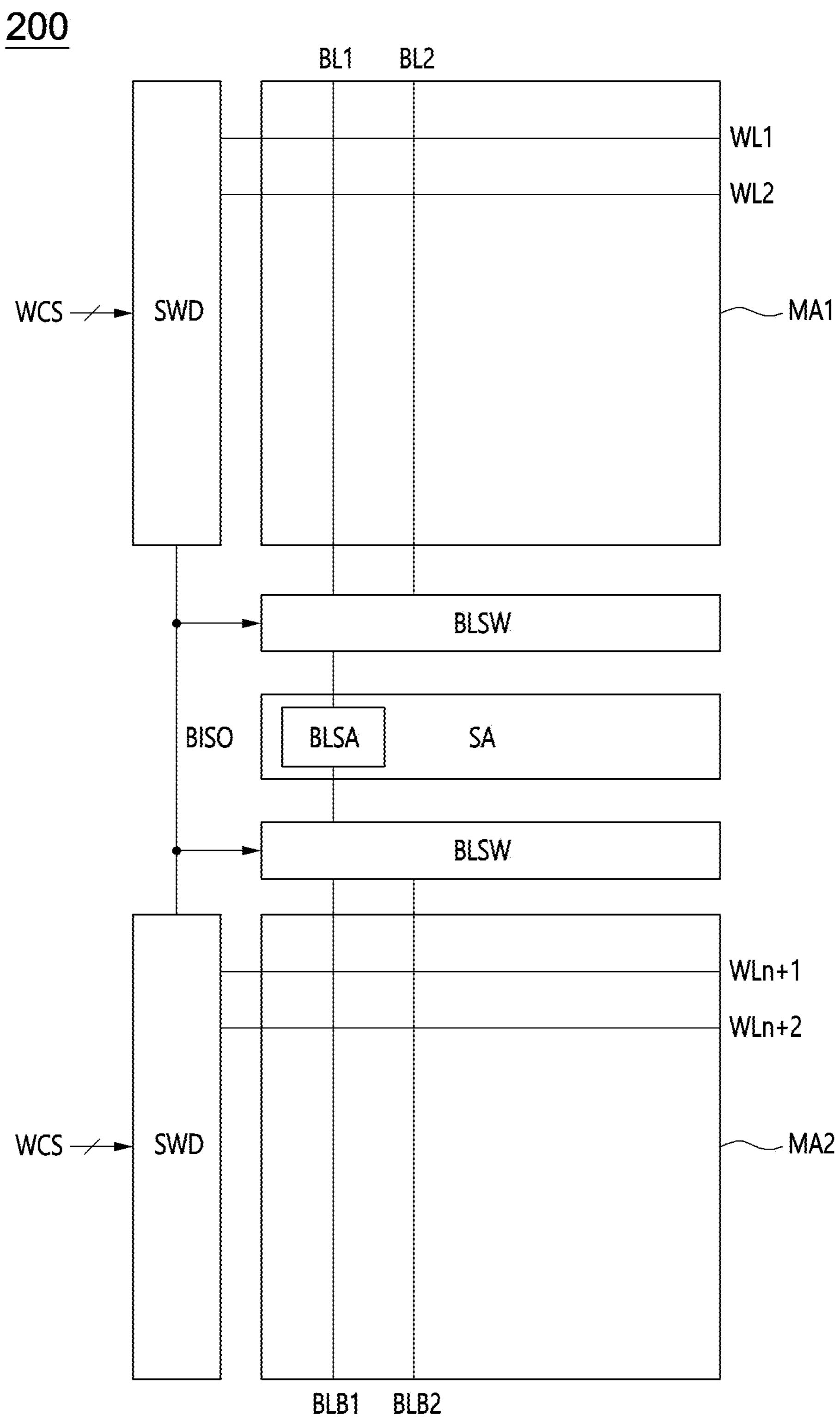
FIG. 2 is a diagram illustrating a configuration of a semiconductor memory apparatus according to an embodiment.

FIG. 2 is a diagram illustrating a configuration of a semiconductor memory apparatus 200 according to an embodiment. The semiconductor memory apparatus 200 may include configurations which are applied as at least one of the first and second memory cell array blocks 111, 112 shown in FIG. 1. In an embodiment, the semiconductor memory apparatus 200 may include a first unit cell array MA1, a second unit cell array MA2, a bitline sense amplifier array SA, a sub-wordline driver SWD, and a bitline switching circuit BLSW. The first and second unit cell arrays MA1, MA2 may include a plurality of bitlines and a plurality of wordlines, and a plurality of memory cells may be electrically coupled at points where the plurality of bitlines and the plurality of wordlines intersect. For example, the first unit cell array MA1 may include at least a first bitline BL1 and a second bitline BL2, and may include at least a first wordline WL1 and a second wordline WL2. The second unit cell array MA2 may include at least a first bitline bar BLB1 and a second bitline bar BLB2, and may include at least a third wordline WLn+1 and a fourth wordline WLn+2. The n may be an integer of 2 or more.

The bitline sense amplifier array SA may be disposed between the first and second unit cell arrays MA1, MA2. The bitline sense amplifier array SA may be electrically coupled to the bitlines of the first and second unit cell arrays MA1, MA2, respectively, to perform an amplification operation. The bitline sense amplifier array SA may include a plurality of bitline sense amplifiers. For example, the bitline sense amplifier array SA may include a bitline sense amplifier BLSA. The bitline sense amplifier BLSA may be electrically coupled to the first bitline BL1 and the first bitline bar BLB1 to amplify and latch the voltage levels of the first bitline BL1 and the first bitline bar BLB1. Although not shown, the bitline sense amplifier array SA may further include a bitline sense amplifier electrically coupled to the second bitline BL2 and the second bitline bar BLB2. The bitline sense amplifier BLSA may include a plurality of transistors to amplify and latch the voltage levels of the first bitline BL1 and the first bitline bar BLB1. The bitline sense amplifier BLSA may perform mismatch compensation operation to compensate for process mismatch or offset between the plurality of transistors before amplifying the voltage levels of the first bitline BL1 and the first bitline bar BLB1.

The sub-wordline driver SWD may receive the wordline control signal WCS. The sub-wordline driver SWD may enable one of the first to fourth wordlines WL1, WL2, WLn+1, WLn+2 based on the wordline control signal WCS. The sub-wordline driver SWD may generate at least one bitline switching signal BISO based on the wordline control signal WCS. The sub-wordline driver SWD may delay the wordline control signal WCS to generate the bitline switching signal BISO. The sub-wordline driver SWD may generate the bitline switching signal BISO by delaying the wordline control signal WCS by a time during which the mismatch compensation operation of the bitline sense amplifier BLSA is performed. The sub-wordline driver SWD may provide the bitline switching signal BISO to the bitline switching circuit BLSW.

The bitline switching circuit BLSW may be electrically coupled with the first bitline BL1, the first bitline bar BLB1, and the bitline sense amplifier BLSA, and may receive the bitline switching signal BISO. The bitline switching circuit BLSW may electrically couple the first bitline BL1 and the first bitline bar BLB1 with the bitline sense amplifier BLSA based on the bitline switching signal BISO. When the bitline switching signal BISO is disabled, the bitline switching circuit BLSW may electrically isolate the first bitline BL1 and the first bitline bar BLB1 from an input node of the bitline sense amplifier BLSA. When the bitline switching signal BISO is enabled, the bitline switching circuit BLSW may electrically couple the first bitline BL1 and the bitline bar BLB1 with the input node of the bitline sense amplifier BLSA.

Figure 3:
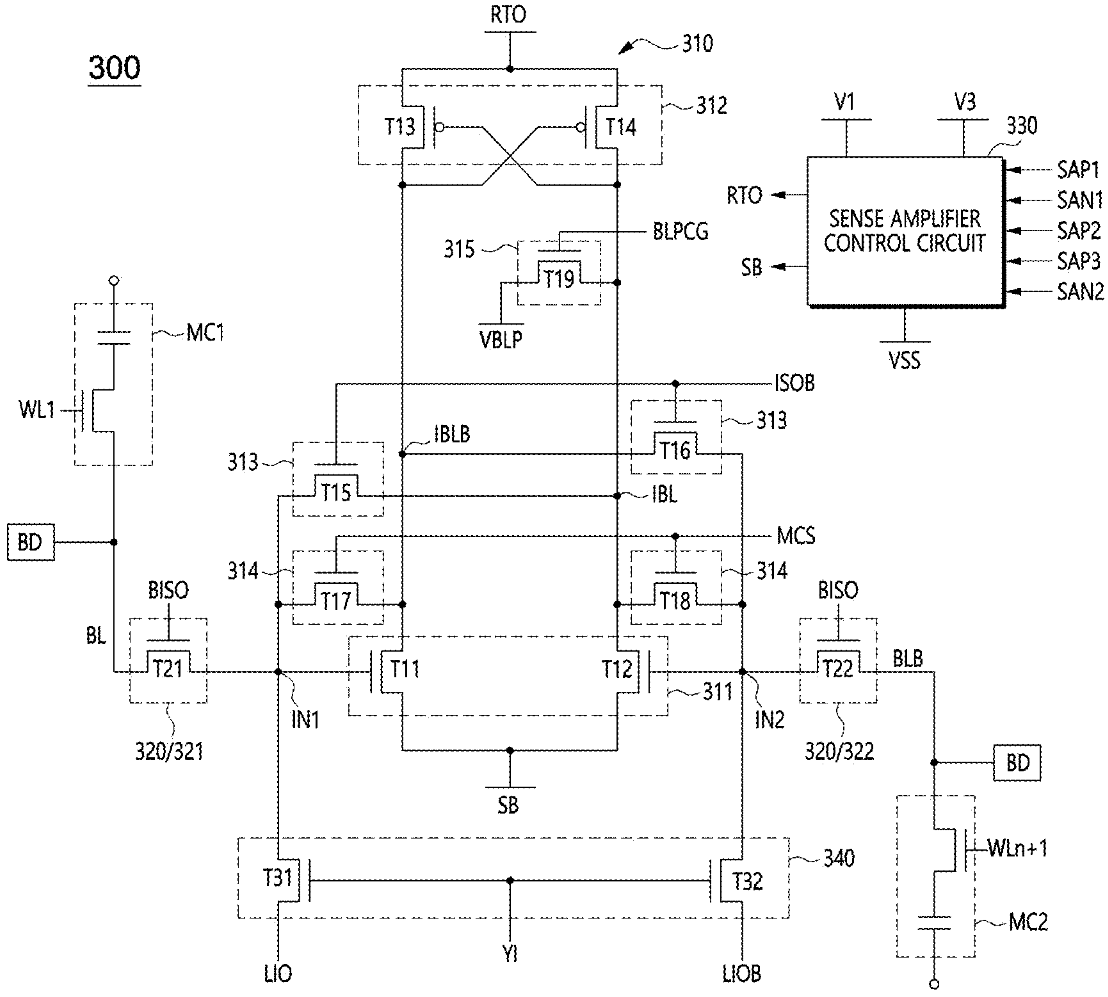
FIG. 3 is a diagram illustrating a configuration of a semiconductor memory apparatus according to an embodiment.

FIG. 3 is a diagram illustrating a configuration of a semiconductor memory apparatus 300 according to an embodiment disclosure. The semiconductor memory apparatus 300 may include configurations which are applied as connection relationship between the bitline sense amplifier BLSA and the first and second unit cell arrays MA1, MA2 of the semiconductor memory apparatus 200 shown in FIG. 2. In an embodiment, the semiconductor memory apparatus 300 may include a bitline sense amplifier 310 and a bitline switching circuit 320. In an embodiment, the semiconductor memory apparatus 300 may include a bitline sense amplifier 310, a bitline switching circuit 320, and a sub-wordline driver SWD. The bitline sense amplifier 310 may amplify and latch signals received through a first input node IN1 and a second input node IN2. The bitline sense amplifier 310 may change voltage levels of a first node IBLB and a second node IBL based on the signals received through the first and second input nodes IN1, IN2. The bitline sense amplifier 310 may change the voltage level of the first node IBLB based on a voltage level of the first input node IN1, and may change the voltage level of the second node IBL based on a voltage level of the second input node IN2.

The bitline switching circuit 320 may receive the bitline switching signal BISO. The bitline switching signal BISO may be a signal generated by the sub-wordline driver SWD shown in FIG. 2. The bitline switching circuit 320 may electrically couple the bitline BL and the bitline bar BLB with the bitline sense amplifier 310 based on the bitline switching signal BISO. Based on the bitline switching signal BISO, the bitline switching circuit 320 may electrically couple the bitline BL with the first input node IN1 and the bitline bar BLB with the second input node IN2. When the bitline switching signal BISO is disabled, the bitline switching circuit 320 may electrically isolate the bitline BL from the first input node IN1 and electrically isolate the bitline bar BLB from the second input node IN2. When the bitline switching signal BISO is enabled, the bitline switching circuit 320 may electrically couple the bitline BL with the first input node IN1 and the bitline bar BLB with the second input node IN2. The bitline BL may be electrically coupled to a first memory cell MC1 when a wordline WL1 is enabled. The bitline bar BLB may be electrically coupled to a second memory cell MC2 when a wordline WLn+1 is enabled.

The semiconductor memory apparatus 300 may further include a sense amplifier control circuit 330 and a column switch 340. The sense amplifier control circuit 330 may receive a sense amplifier control signal and supply a voltage to a first power terminal RTO and a second power terminal SB of the bitline sense amplifier 310. The sense amplifier control circuit 330 may receive at least a first control signal SAP1 and a second control signal SAN1. The sense amplifier control circuit 330 may provide a first internal voltage V1 to the first power terminal RTO based on the first control signal SAP1. The first internal voltage V1 may be the first internal voltage V1 shown in FIG. 1. The sense amplifier control circuit 330 may provide the first internal voltage V1 to the first power terminal RTO when the first control signal SAP1 is enabled, and might not provide the first internal voltage V1 to the first power terminal RTO when the first control signal SAP1 is disabled. The sense amplifier control circuit 330 may electrically couple the second power supply terminal SB with a ground voltage VSS based on a second control signal SAN1. The sense amplifier control circuit 330 may electrically couple the second power terminal SB with the ground voltage VSS when the second control signal SAN1 is enabled, and might not electrically couple the second power terminal SB with the ground voltage VSS when the second control signal SAN1 is disabled.

The sense amplifier control circuit 330 may further receive a third control signal SAP2, a fourth control signal SAP3, and a fifth control signal SAN2. The sense amplifier control circuit 330 may provide a third internal voltage V3 to the first power terminal RTO based on the third control signal SAP2. The third internal voltage V3 may be the third internal voltage V3 shown in FIG. 1. The sense amplifier control circuit 330 may provide the third internal voltage V3 to the first power terminal RTO when the third control signal SAP2 is enabled, and might not provide the third internal voltage V3 to the first power terminal RTO when the third control signal SAP2 is disabled. The third control signal SAP2 may be a signal controlled independently of the first control signal SAP1. In an embodiment, the sense amplifier control circuit 330 may be modified to provide the first internal voltage V1 instead of the third internal voltage V3 based on the third control signal SAP2. The sense amplifier control circuit 330 may provide the first internal voltage V1 to the first power terminal RTO based on the fourth control signal SAP3. The sense amplifier control circuit 330 may provide the first internal voltage V1 to the first power terminal RTO when the fourth control signal SAP3 is enabled, and might not provide the first internal voltage V1 to the first power terminal RTO when the fourth control signal SAP3 is disabled. The fourth control signal SAP3 may be a signal controlled together with the third control signal SAP2. The sense amplifier control circuit 330 may electrically couple the second power supply terminal SB with the ground voltage VSS based on the fifth control signal SAN2. The sense amplifier control circuit 330 may electrically couple the second power terminal SB with the ground voltage VSS when the fifth control signal SAN2 is enabled, and might not electrically couple the second power terminal SB with the ground voltage VSS when the fifth control signal SAN2 is disabled. The fifth control signal SAN2 may be a signal controlled together with the second control signal SAN1.

The column switch 340 may be electrically coupled to the bitline BL, the bitline bar BLB, the local input/output line LIO, the local input/output line bar LIOB, and may receive the column selection signal YI. Based on the column selection signal YI, the column switch 340 may electrically couple the bitline BL with the local input/output line LIO, and may electrically couple the bitline bar BLB with the local input/output line bar LIOB. When the column selection signal YI is disabled, the column switch 340 may electrically isolate the bitline BL from the local input/output line LIO, and may electrically isolate the bitline bar BLB from the local input/output line bar LIOB. When the column selection signal YI is enabled, the column switch 340 may electrically couple the bitline BL with the local input/output line LIO, and the bitline bar BLB with the local input/output line bar LIOB.

The bitline sense amplifier 310 may include an input circuit 311, a latch circuit 312, an isolation switching circuit 313, and a compensation switching circuit 314. The input circuit 311 is electrically coupled with the first input node IN1, the second input node IN2, the first node IBLB, and the second node IBL, and may change the voltage levels of the first and second nodes IBLB, IBL according to the voltage levels of the first and second input nodes IN1, IN2. The input circuit 311 may change the voltage level of the first node IBLB according to the voltage level of the first input node IN1, and may change the voltage level of the second node IBL according to the voltage level of the second input node IN2. The input circuit 311 may include a first transistor T11 and a second transistor T12. The first and second transistors T11, T12 may be N-channel MOS transistors. A gate of the first transistor T11 may be connected with the first input node IN1, a drain of the first transistor T11 may be connected with the first node IBLB, and a source of the first transistor T11 may be connected with the second power terminal SB. A gate of the second transistor T12 is connected with the second input node IN2, a drain of the second transistor T12 is connected with the second node IBL, and a source of the second transistor T12 may be connected with the second power terminal SB.

The latch circuit 312 may latch the voltage levels of the first and second nodes IBLB, IBL based on the voltage levels of the first and second nodes IBLB, IBL. The latch circuit 312 may change the voltage level of the second node IBL based on the voltage level of the first node IBLB, and may change the voltage level of the first node IBLB based on the voltage level of the second node IBL. The latch circuit 312 may include a third transistor T13 and a fourth transistor T14. The third and fourth transistors T13, T14 may be P-channel MOS transistors. A gate of the third transistor T13 may be connected with the second node IBL, a source of the third transistor T13 may be connected with the first power terminal RTO, and a drain of the third transistor T13 may be connected with the first node IBLB. A gate of the fourth transistor T14 is connected with the first node IBLB, a source of the fourth transistor T14 is connected with the first power terminal RTO, and a drain of the fourth transistor T14 may be connected with the second node IBL.

The isolation switching circuit 313 may be electrically coupled with the first input node IN1, the second input node IN2, the first node IBLB, and the second node IBL, and may receive the isolation switching signal ISOB. Based on the isolation switching signal ISOB, the isolation switching circuit 313 may electrically couple the first input node IN1 with the second node IBL, and may electrically couple the second input node IN2 with the first node IBLB. When the isolation switching signal ISOB is disabled, the isolation switching circuit 313 may electrically isolate the first input node IN1 from the second node IBL, and may electrically isolate the second input node IN2 from the first node IBLB. When the isolation switching signal ISOB is enabled, the isolation switching circuit 313 may electrically couple the first input node IN1 with the second node IBL, and the second input node IN2 with the first node IBLB. The isolation switching circuit 313 may include a fifth transistor T15 and a sixth transistor T16. The fifth and sixth transistors T15, T16 may be N-channel MOS transistors. The fifth transistor T15 is connected between the first input node IN1 and the second node IBL, and a gate of the fifth transistor T15 may receive the isolated switching signal ISOB. The sixth transistor T16 is connected between the second input node IN2 and the first node IBLB, and a gate of the sixth transistor T16 may receive the isolation switching signal ISOB.

The compensation switching circuit 314 is electrically coupled with the first input node IN1, the second input node IN2, the first node IBLB, and the second node IBL, and may receive a mismatch compensation signal MCS. Based on the mismatch compensation signal MCS, the compensation switching circuit 314 may electrically couple the first input node IN1 with the first node IBLB and the second input node IN2 with the second node IBL. When the mismatch compensation signal MCS is disabled, the compensation switching circuit 314 may electrically isolate the first input node IN1 from the first node IBLB, and may electrically isolate the second input node IN2 from the second node IBL. When the mismatch compensation signal MCS is enabled, the compensation switching circuit 314 may electrically couple the first input node IN1 with the first node IBLB and the second input node IN2 with the second node IBL. The compensation switching circuit 314 may include a seventh transistor T17 and an eighth transistor T18. The seventh and eighth transistors T17, T18 may be N-channel MOS transistors. The seventh transistor T17 is connected between the first input node IN1 and the first node IBLB, and a gate of the seventh transistor T17 may receive the mismatch compensation signal MCS. The eighth transistor T18 is connected between the second input node IN2 and the second node IBL, and a gate of the eighth transistor T18 may receive the mismatch compensation signal MCS.

The bitline sense amplifier 310 may further include a bitline precharge circuit 315. The bitline precharge circuit 315 may precharge the second node IBL with a bitline precharge voltage VBLP based on a bitline precharge signal BLPCG. For example, the bitline precharge voltage VBLP may have a voltage level corresponding to half of the first internal voltage V1 or a voltage level corresponding to half of the third internal voltage V3. The bitline precharge circuit 315 may include a ninth transistor T19. The ninth transistor T19 may be an N-channel MOS transistor. A gate of the ninth transistor T19 may receive the bitline precharge signal BLPCG, one of a drain and a source of the ninth transistor T19 may be connected with the second node IBL, and the other of the drain and the source of the ninth transistor T19 may be connected with a terminal to which the bitline precharge voltage VBLP is supplied. The first to fifth control signals SAP1, SAN1, SAP2, SAP3, SAN2, the isolation switching signal ISOB, the mismatch compensation signal MCS, and the bitline precharge signal BLPCG may be generated on the basis of the active signal ACT shown in FIG. 1, and may be enabled and disabled at a predetermined timing when the active signal ACT is enabled. The word "predetermined" as used herein with respect to a parameter, such as a predetermined timing, time, or voltage level, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The bitline switching circuit 320 may include a first switch 321 and a second switch 322 as indicated in FIG. 3 by 320/321 and 320/322, respectively. The first switch 321 may electrically couple the bitline BL and the first input node IN1 based on the bitline switching signal BISO. When the bitline switching signal BISO is disabled, the first switch 321 may electrically isolate the bitline BL from the first input node IN1. When the bitline switching signal BISO is enabled, the first switch 321 may electrically couple the bitline BL with the first input node IN1. The first switch 321 may include a first transistor T21. The first transistor T21 may be an N-channel MOS transistor. The first transistor T21 is connected between the bitline BL and the first input node IN1, and a gate of the first transistor T21 may receive the bitline switching signal BISO. The second switch 322 may electrically couple the bitline bar BLB and the second input node IN2 based on the bitline switching signal BISO. When the bitline switching signal BISO is disabled, the second switch 322 may electrically isolate the bitline bar BLB from the second input node IN2. When the bitline switching signal BISO is enabled, the second switch 322 may electrically couple the bitline bar BLB with the second input node IN2. The second switch 322 may include a second transistor T22. The second transistor T22 may be an N-channel MOS transistor. The second transistor T22 is connected between the bitline bar BLB and the second input node IN2, and a gate of the second transistor T22 may receive the bitline switching signal BISO.

The column switch 340 may include a first transistor T31 and a second transistor T32. The first and second transistors T31, T32 may be N-channel MOS transistors. The first transistor T31 is connected between the first input node IN1 and the local input/output line LIO, and a gate of the first transistor T31 may receive the column selection signal YI. The second transistor T32 is connected between the second input node IN2 and the local input/output line bar LIOB, and a gate of the second transistor T32 may receive the column selection signal YI.

In an embodiment, the bitline BL and the bitline bar BLB may each be electrically coupled with a bleeder circuit BD. The bleeder circuit BD may precharge the voltage levels of the bitline BL and the bitline bar BLB to a predetermined voltage level. For example, the bleeder circuit BD may precharge the bitline BL and the bitline bar BLB to the bitline precharge voltage VBLP by electrically coupling a terminal supplied with the bitline precharge voltage VBLP to the bitline BL and the bitline bar BLB.

Figure 4:
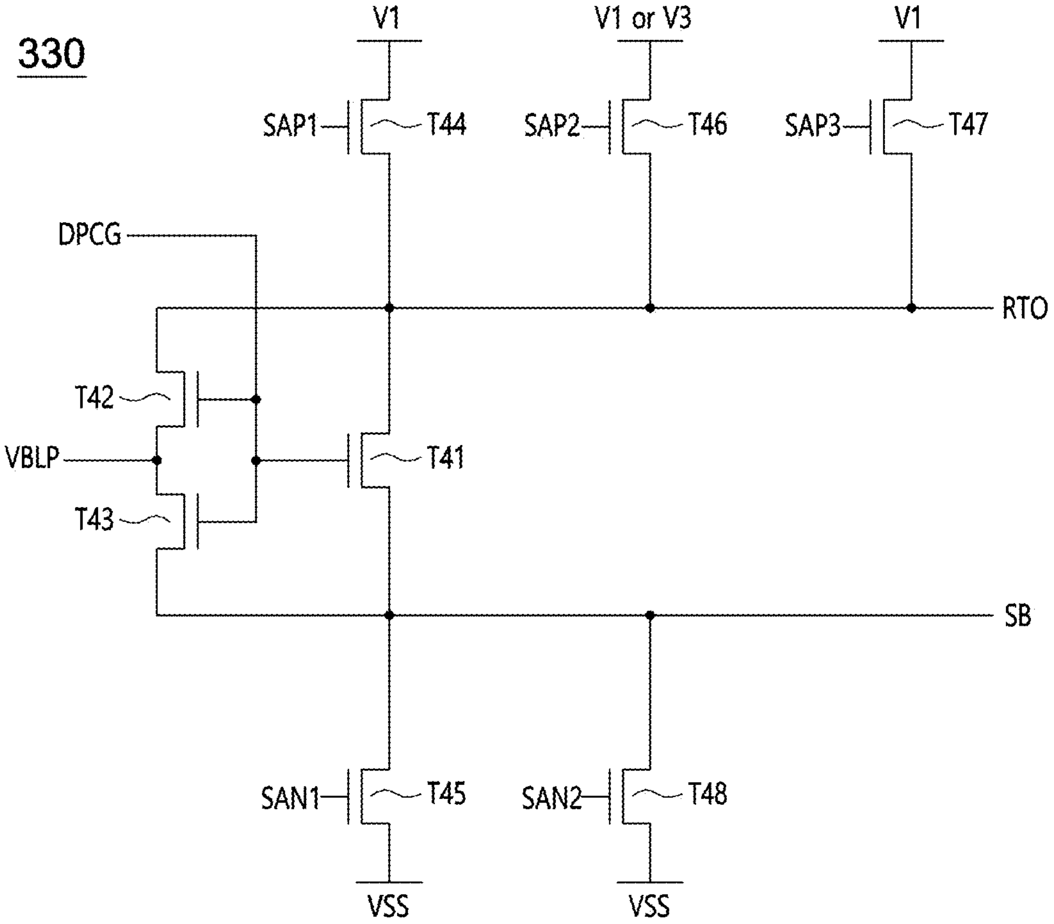
FIG. 4 is a diagram illustrating a configuration of a sense amplifier control circuit shown in FIG. 3.

FIG. 4 is a diagram illustrating a configuration of the sense amplifier control circuit 330 shown in FIG. 3. Referring to FIG. 4, the sense amplifier control circuit 330 may include a first transistor T41, a second transistor T42, a third transistor T43, a fourth transistor T44, a fifth transistor T45, a sixth transistor T46, a seventh transistor T47, and an eighth transistor T48. The first to eighth transistors T41-T48 may be N-channel MOS transistors. The sense amplifier control circuit may further receive a driver precharge signal DPCG. The first transistor T41 may be connected between the first power terminal RTO and the second power terminal SB, and a gate of the first transistor T41 may receive the driver precharge signal DPCG. The second transistor T42 is connected between the first power terminal RTO and the terminal to which the bitline precharge voltage VBLP is supplied, and a gate of the second transistor T42 may receive the driver precharge signal DPCG. The third transistor T43 is connected between the second power terminal SB and the terminal to which the bitline precharge voltage VBLP is supplied, and a gate of the third transistor T43 may receive the driver precharge signal DPCG. A gate of the fourth transistor T44 may receive the first control signal SAP1, a drain of the fourth transistor T44 may receive the first internal voltage V1, and a source of the fourth transistor T44 may be connected with the first power terminal RTO. A gate of the fifth transistor T45 may receive the second control signal SAN1, a drain of the fifth transistor T45 is connected to the second power terminal SB, and a source of the fifth transistor T45 may be connected to the ground voltage VSS. A gate of the sixth transistor T46 may receive the third control signal SAP2, a drain of the sixth transistor T46 may receive the third internal voltage V3, and a source of the sixth transistor T46 may be connected to the first power terminal RTO. In an embodiment, the drain of the sixth transistor T46 may be modified to receive the first internal voltage V1 instead of the third internal voltage V3. A gate of the seventh transistor T47 may receive the fourth control signal SAP3, a drain of the seventh transistor T47 may receive the first internal voltage V1, and a source of the seventh transistor T47 may be connected with the first power terminal RTO. A gate of the eighth transistor T48 may receive the fifth control signal SAN2, a drain of the eighth transistor T48 is connected to the second power terminal SB, and a source of the eighth transistor T48 may be connected to the ground voltage VSS.

When the driver precharge signal DPCG is enabled, the first to third transistors T41, T42, T43 may be turned on. The first transistor T41 may electrically couple the first and second power terminals RTO, SB, and the second and third transistors T42, T43 may provide the bitline precharge voltage VBLP to the first and second power terminals RTO, SB. When the driver precharge signal DPCG is disabled, the sense amplifier control circuit 330 may supply power to the first and second power terminals RTO, SB. When at least one of the first, third, and fourth control signals SAP1, SAP2, SAP3 is enabled, the fourth, sixth, and seventh transistors T44, T46, T47 may supply the first internal voltage V1 or the third internal voltage V3 to the first power terminal RTO. When at least one of the second and fifth control signals SAN1, SAN2 is enabled, the fifth and eighth transistors T45, T48 may electrically couple the second power supply terminal SB with the ground voltage VSS.

Figure 5:
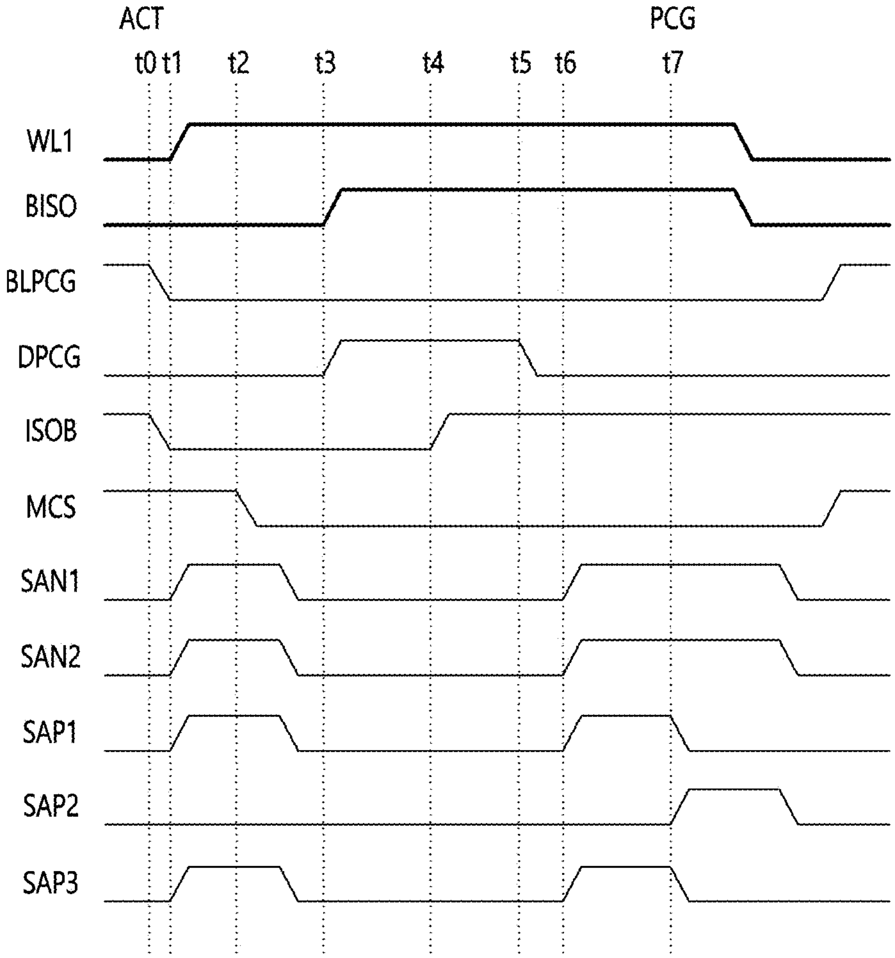
FIG. 5 is a timing diagram illustrating an operation of a semiconductor memory apparatus according to an embodiment.

FIG. 5 is a timing diagram illustrating an operation of the semiconductor memory apparatus 300 according to an embodiment. Referring to FIGS. 1 to 5, a method of operation of the semiconductor memory apparatus 300 according to an embodiment will be described as follows. Before t0, the bitline precharge signal BLPCG, the isolation switching signal ISOB, and the mismatch compensation signal MCS may be enabled. The bitline switching signal BISO may remain disabled. Accordingly, the first node IBLB, the second node IBL, the first input node IN1, and the second input node IN2 may be in a precharged state with the bitline precharge voltage VBLP. At t0, when the active signal ACT is received, the bitline precharge signal BLPCG and the isolation switching signal ISOB may be disabled, the first input node IN1 and the second node IBL may be electrically isolated, and the second input node IN2 and the first node IBLB may be electrically isolated. Because the mismatch compensation signal MCS remains enabled, the electrically coupling between the first input node IN1 and the first node IBLB and the electrically coupling between the second input node IN2 and the second node IBL may be maintained. At t1, the first control signal SAP1, the second control signal SAN1, the fourth control signal SAP3, and the fifth control signal SAN2 are enabled, and the sense amplifier control circuit 330 may provide the first internal voltage V1 to the first power terminal RTO and electrically couple the second power terminal SB with the ground voltage VSS. With power supplied to the first and second power terminals RTO, SB of the bitline sense amplifier 310, the bitline sense amplifier 310 is activated, and the bitline sense amplifier 310 may perform a mismatch compensation operation. Depending on a threshold voltage mismatch or offset between the first and second transistors T11, T12 and a threshold voltage mismatch or offset between the third and fourth transistors T13, T14, the voltage levels of the first input node IN1 and the second input node IN2 may be set differently. Further, a wordline WL1 may be enabled at t1. As the wordline WL1 is enabled, the bitline BL and the first memory cell MC1 may be electrically coupled, and charge sharing between the bitline BL and the memory cell MC1 may be performed. When the data stored in the memory cell MC1 is 1, the voltage level of the bitline BL may be slightly higher than the voltage level of the bitline precharge voltage VBLP. When the data stored in the memory cell MC1 is 0, the voltage level of the bitline BL may be slightly lower than the voltage level of the bitline precharge voltage VBLP.

At t2, the mismatch compensation signal MCS may be disabled, the first input node IN1 and the first node IBLB may be electrically isolated, and the second input node IN2 and the second node IBL may be electrically isolated. After the mismatch compensation signal MCS is disabled, the first, second, fourth, and fifth control signals SAP1, SAN1, SPA3, SAN2 may be disabled. At t3, the bitline switching signal BISO may be enabled. When the bitline switching signal BISO is enabled, the first switch 321 may electrically couple the first input node IN1 with the bitline BL, and the second switch 322 may electrically couple the second input node IN2 with the bitline bar BLB. Accordingly, the voltage level of the first input node IN1 may be changed in accordance with the voltage level of the bitline BL, and the voltage level of the second input node IN2 may be changed in accordance with the voltage level of the bitline bar BLB. At t3, the driver precharge signal DPCG is enabled, and the sense amplifier control circuit 330 may disable the bitline sense amplifier 310 by setting the first and second power terminals RTO, SB to a voltage level of the bitline precharge voltage VBLP. At t4, the isolation switching signal ISOB may be enabled. When the isolation switching signal ISOB is enabled, the first input node IN1 may be electrically coupled with the second node IBL, and the second input node IN2 may be electrically coupled with the first node IBLB. At t5, the driver precharge signal DPCG may be disabled, and after the driver precharge signal DPCG is disabled, the first, second, fourth, and fifth control signals SAP1, SAN1, SAP3, SAN2 may be enabled. The bitline sense amplifier 310 is enabled when the sense amplifier control circuit 330 supplies the first internal voltage V1 to the first power terminal RTO and electrically couples the second power terminal SB with the ground voltage VSS. The bitline sense amplifier 310 may amplify the voltage levels of the bitline BL and the bitline bar BLB to develop the first and second nodes IBLB, IBL to logic levels opposite to each other. At t6, the first and fourth control signals SAP1, SAP3 may be disabled, the third control signal SAP2 may be enabled, and the voltage levels of the bitline BL, the bitline bar BLB, the first node IBLB, and the second node IBL may continue to be developed. When the data stored in the first memory cell MC1 electrically coupled with the bitline BL is 1, the input circuit 311 may cause the voltage level of the first node IBLB to fall below the voltage level of the second node IBL in accordance with the voltage level of the first input node IN1. Thus, the latch circuit 312 may drive the second node IBL to a high logic level, and may drive the first node IBLB to a low logic level.

When a precharge signal PCG is received at t7, the wordline WL1 may be disabled, and the bitline switching signal BISO may be disabled. Subsequently, the second, third, and fifth control signals SAN1, SAP2, SAN2 may be disabled. Further, as the bitline precharge signal BLPCG and the mismatch compensation signal MCS are enabled, the first input node IN1, the second input node IN2, the first node IBLB, and the second node IBL may be precharged to the bitline precharge voltage VBLP.

Figure 6A:
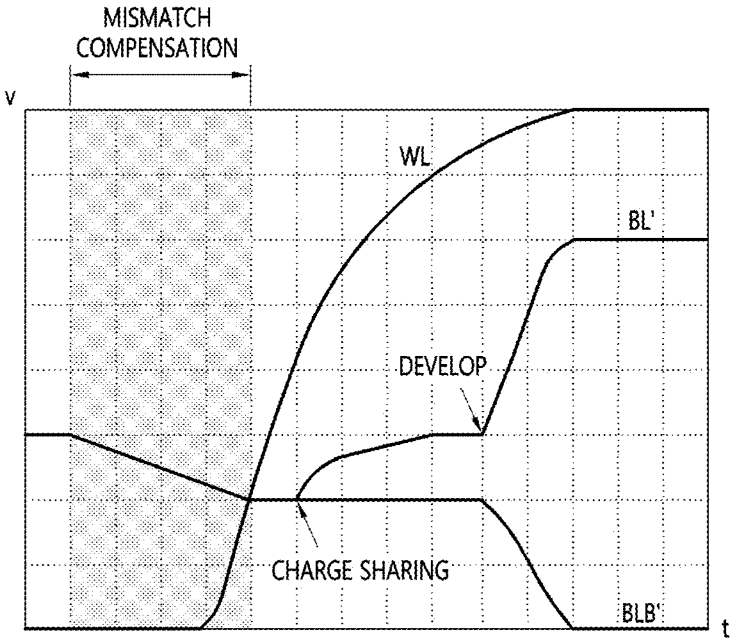
FIG. 6A is a timing diagram illustrating an operation of a comparison example of a semiconductor memory apparatus.
Figure 6B:
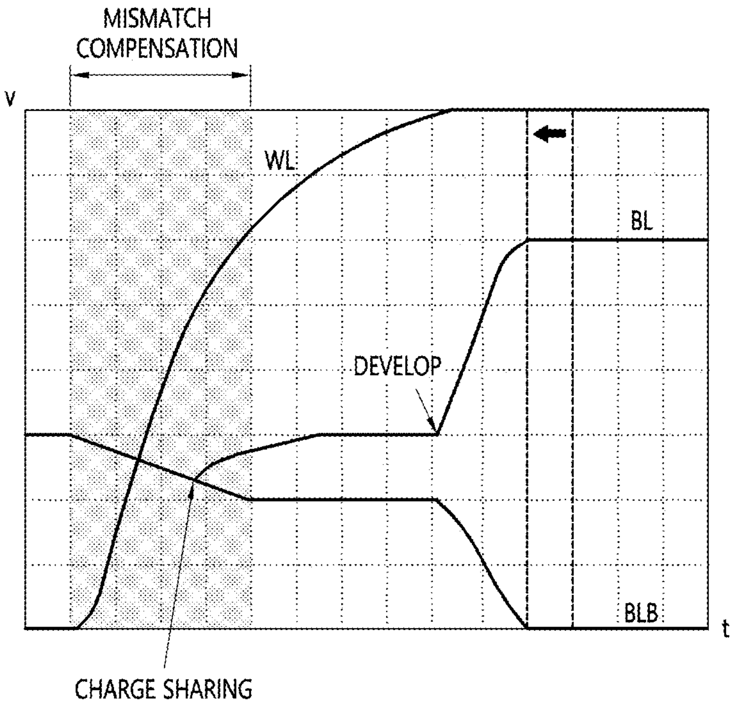
FIG. 6B is a timing diagram illustrating an operation of a semiconductor memory apparatus according to an embodiment.

FIG. 6A is a timing diagram illustrating an operation of a comparison example of a semiconductor memory apparatus, and FIG. 6B is a timing diagram illustrating an operation of a semiconductor memory apparatus according to an embodiment. In FIGS. 6A and 6B, a horizontal axis of the timing diagram may be a time t (for example, second), and a vertical axis may be a voltage level V. Referring to FIG. 6A, in a comparison example of a semiconductor memory apparatus, a bitline BL' and an input node of a bitline sense amplifier are not electrically isolated, so that a wordline WL may be enabled after a mismatch compensation operation of the bitline sense amplifier is performed. If the wordline is enabled substantially at the same time as the start of the mismatch compensation operation of the bitline sense amplifier, the mismatch compensation operation and an amplification operation of the bitline BL' and the bitline bar BLB' cannot be performed normally because a voltage level change caused by the mismatch compensation operation and a voltage level change caused by charge sharing conflict, making it difficult to define a voltage level of the input node of the bitline sense amplifier. As a result, after the mismatch compensation operation is completed, the wordline WL can be enabled, and when the wordline WL is enabled, charge sharing of bitline BL' occurs, and the bitline sense amplifier may amplify the bitline BL' and the bitline bar BLB' to develop a voltage level difference of the bitline BL' and the bitline bar BLB'.

Referring to FIGS. 3 and 6B, the semiconductor memory apparatus 300 according to an embodiment may electrically isolate the bitline BL and the input node of the bitline sense amplifier 310. Thus, in an embodiment, the wordline WL may be enabled substantially simultaneously with the start of the mismatch compensation operation of the bitline sense amplifier 310. When the wordline WL is enabled, charge sharing of the bitline BL is performed, but because the bitline BL and the input node of the bitline sense amplifier 310 are electrically isolated, the mismatch compensation operation can be performed normally regardless of the change in a voltage level of the bitline BL. In an embodiment, when the mismatch compensation operation is completed, the semiconductor memory apparatus 300 may electrically couple the bitline BL and the input node of the bitline sense amplifier 310. In an embodiment, because the charge sharing of the bitline BL has already been completed, the bitline sense amplifier 310 can immediately develop a voltage level difference between the bitline BL and the bitline bar BLB, and the timing of developing the voltage level difference between the bitline BL and the bitline bar BLB can be earlier than that shown in FIG. 6A. If, in an embodiment, the timing at which the voltage level difference between the bitline BL and the bitline bar BLB is developed is accelerated, the timing at which the read operation and the write operation of the semiconductor memory apparatus 300 are performed may be accelerated, and one of the timing specifications of the semiconductor memory apparatus 300, tRCD (RAS to CAS delay), may be reduced, thereby improving the performance of the semiconductor memory apparatus 300. The words “simultaneous” and “simultaneously” as used herein with respect to processes mean that the processes take place on overlapping intervals of time. For example, if a first process takes place over a first interval of time and a second process takes place simultaneously over a second interval of time, then the first and second intervals at least partially overlap each other such that there exists a time at which the first and second processes are both taking place.

Figure 7:
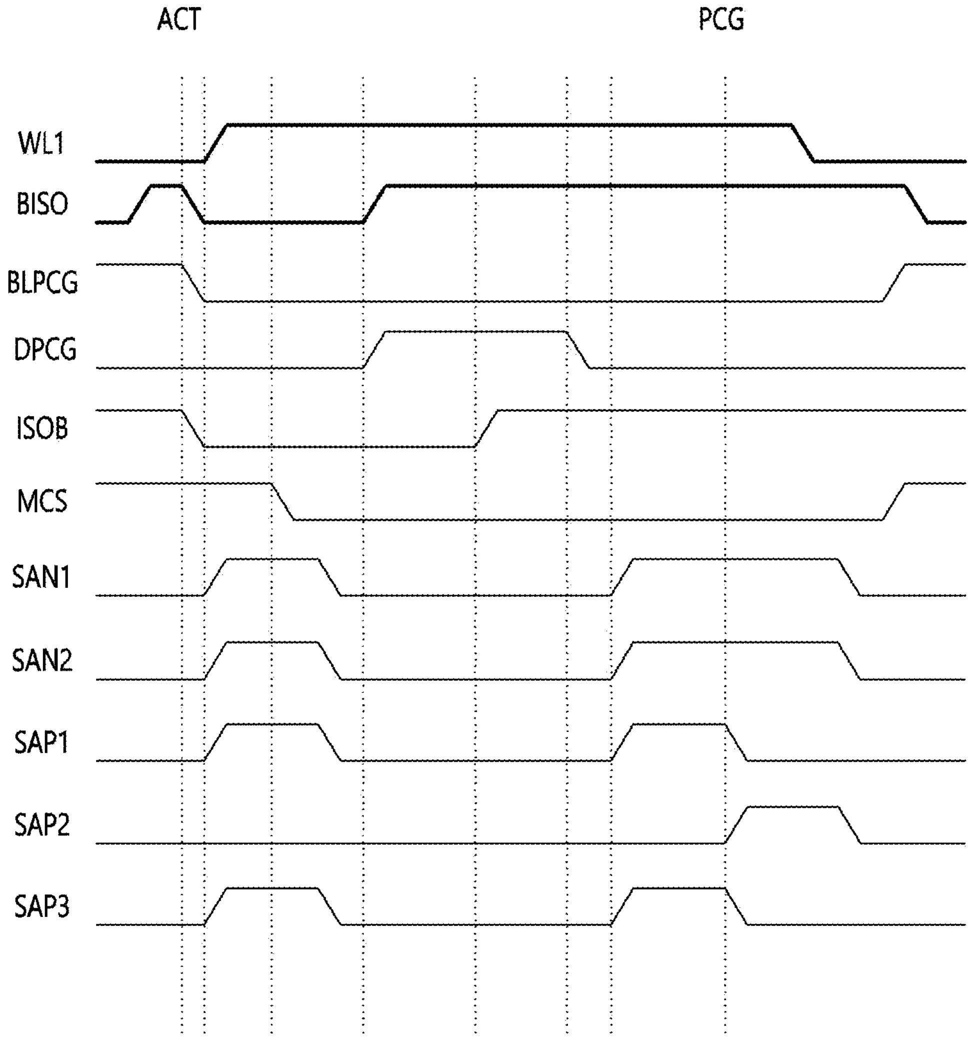
FIG. 7 is a timing diagram illustrating an operation of a semiconductor memory apparatus according to an embodiment.

FIG. 7 is a timing diagram illustrating an operation of the semiconductor memory apparatus 300 according to an embodiment. FIG. 7 may illustrate an operation of the semiconductor memory apparatus 300 when the bleeder circuit BD shown in FIG. 3 is not provided. When the bleeder circuit BD is not provided and the bitline BL is electrically isolated from the bitline sense amplifier 310, a situation where the bitline BL and the bitline bar BLB are floating may occur, because the bitline BL and the bitline bar BLB are difficult to be precharged with the bitline precharge voltage VBLP. Therefore, the semiconductor memory apparatus 300 may enable the bitline switching signal BISO for a predetermined time before the mismatch compensation operation is performed and before enabling the wordline WL. When the bitline switching signal BISO is enabled for a predetermined time, the bitline BL and the bitline bar BLB may be electrically coupled to the first and second input nodes IN1, IN2 of the bitline sense amplifier 310, and the bitline BL and the bitline bar BLB may be precharged to the bitline precharge voltage VBLP by the bitline precharge circuit 315. The operation after the active signal ACT is received may be substantially the same as in FIG. 5.

Figure 8:
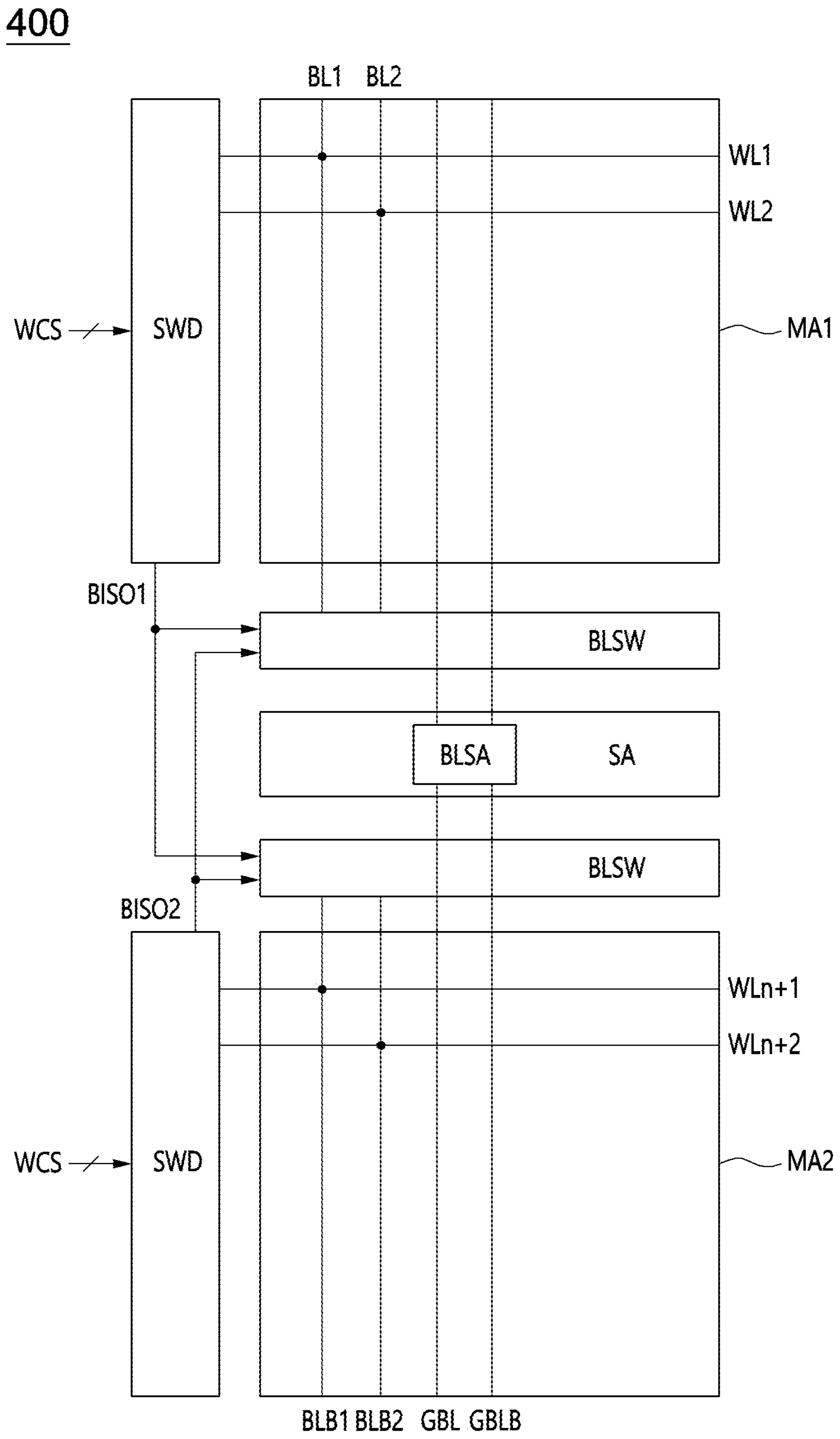
FIG. 8 is a diagram illustrating a configuration of a semiconductor memory apparatus according to an embodiment.

FIG. 8 is a diagram illustrating a configuration of a semiconductor memory apparatus 400 according to an embodiment. The semiconductor memory apparatus 400 may include configurations which are applied as at least one of the first and second memory cell array blocks 111, 112 shown in FIG. 1. In an embodiment, the semiconductor memory apparatus 400 may include a first unit cell array MA1, a second unit cell array MA2, a bitline sense amplifier array SA, a sub-wordline driver SWD, and a bitline switching circuit BLSW. The first and second unit cell arrays MA1, MA2 may include a plurality of bitlines and a plurality of wordlines, and a plurality of memory cells may be electrically coupled at points where the plurality of bitlines and the plurality of wordlines intersect. For example, the first unit cell array MA1 may include at least a first bitline BL1 and a second bitline BL2, and may include at least a first wordline WL1 and a second wordline WL2. The second unit cell array MA2 may include at least a first bitline bar BLB1 and a second bitline bar BLB2, and may include at least a third wordline WLn+1 and a fourth wordline WLn+2. The n may be an integer of 2 or more. The semiconductor memory apparatus 400 may have a hierarchical bitline structure. The first bitline BL1 may be electrically coupled with the first wordline WL1, and the second bitline BL2 may be electrically coupled with the second wordline WL2. The first bitline bar BLB1 may be electrically coupled with the third wordline WLn+1, and the second bitline bar BLB2 may be electrically coupled with the fourth wordline WLn+2. The first and second unit cell arrays MA1, MA2 may be arranged with a global bitline GBL and a global bitline bar GBLB. The first and second bitlines BL1, BL2 may be selectively electrically coupled with the global bitline GBL, and the first and second bitline bars BLB1, BLB2 may be selectively electrically coupled with the global bitline bar GBLB. In an embodiment, the number of bitlines electrically coupled with one global bitline may be four or more.

The bitline sense amplifier array SA may be disposed between the first and second unit cell arrays MA1, MA2. The bitline sense amplifier array SA may be electrically coupled with the global bitline GBL and the global bitline bar GBLB to perform an amplification operation. The bitline sense amplifier array SA may include a plurality of bitline sense amplifiers. The number of the bitline sense amplifiers included in the bitline sense amplifier array SA may change depending on the number of the global bitline GBL. For example, the bitline sense amplifier array SA may include a bitline sense amplifier BLSA. The bitline sense amplifier BLSA may be electrically coupled to the global bitline GBL and the global bitline bar GBLB to amplify and latch voltage levels of the global bitline GBL and the global bitline bar GBLB.

The sub-wordline driver SWD may receive the wordline control signal WCS. The sub-wordline driver SWD may enable one of the first to fourth wordlines WL1, WL2, WLn+1, WLn+2 based on the wordline control signal WCS. The sub-wordline driver SWD may generate at least a first bitline switching signal BISO1 and a second bitline switching signal BISO2 based on the wordline control signal WCS. The sub-wordline driver SWD may delay the wordline control signal WCS to generate the first and second bitline switching signals BISO1, BISO2. The sub-wordline driver SWD may delay the wordline control signal WCS to generate the first bitline switching signal BISO1 when one of the first and third wordlines WL1, WLn+1 is enabled by the wordline control signal WCS. The sub-wordline driver SWD may delay the wordline control signal WCS to generate the second bitline switching signal BISO2 when one of the second and fourth wordlines WL2, WLn+2 is enabled by the wordline control signal WCS. The sub-wordline driver SWD may generate the first and second bitline switching signals BISO1, BISO2 by delaying the wordline control signal WCS by a time during which the mismatch compensation operation of the bitline sense amplifier BLSA is performed. The sub-wordline driver SWD may provide the first and second bitline switching signals BISO1, BISO2 to the bitline switching circuit BLSW.

The bitline switching circuit BLSW may be electrically coupled with the first bitline BL1, the second bitline BL2, the first bitline bar BLB1, the second bitline bar BLB2, the global bitline GBL, and the global bitline bar GBLB, and may receive the first and second bitline switching signals BISO1, BISO2. The bitline switching circuit BLSW may electrically couple the first bitline BL1 and the first bitline bar BLB1 with the global bitline GBL and the global bitline bar GBLB, respectively, based on the first bitline switching signal BISO1. When the first bitline switching signal BISO1 is disabled, the bitline switching circuit BLSW may electrically isolate the first bitline BL1 and the first bitline bar BLB1 from the global bitline GBL and the global bitline bar GBLB, respectively. When the first bitline switching signal BISO1 is enabled, the bitline switching circuit BLSW may electrically couple the first bitline BL1 with the global bitline GBL and the first bitline bar BLB1 with the global bitline bar GBLB. The bitline switching circuit BLSW may electrically couple the second bitline BL2 and the second bitline bar BLB2 with the global bitline GBL and the global bitline bar GBLB, respectively, based on the second bitline switching signal BISO2. When the second bitline switching signal BISO2 is disabled, the bitline switching circuit BLSW may electrically isolate the second bitline BL2 and the second bitline bar BLB2 from the global bitline GBL and the global bitline bar GBLB, respectively. When the second bitline switching signal BISO2 is enabled, the bitline switching circuit BLSW may electrically couple the second bitline BL2 with the global bitline GBL and the second bitline bar BLB2 with the global bitline bar GBLB.

Figure 9:
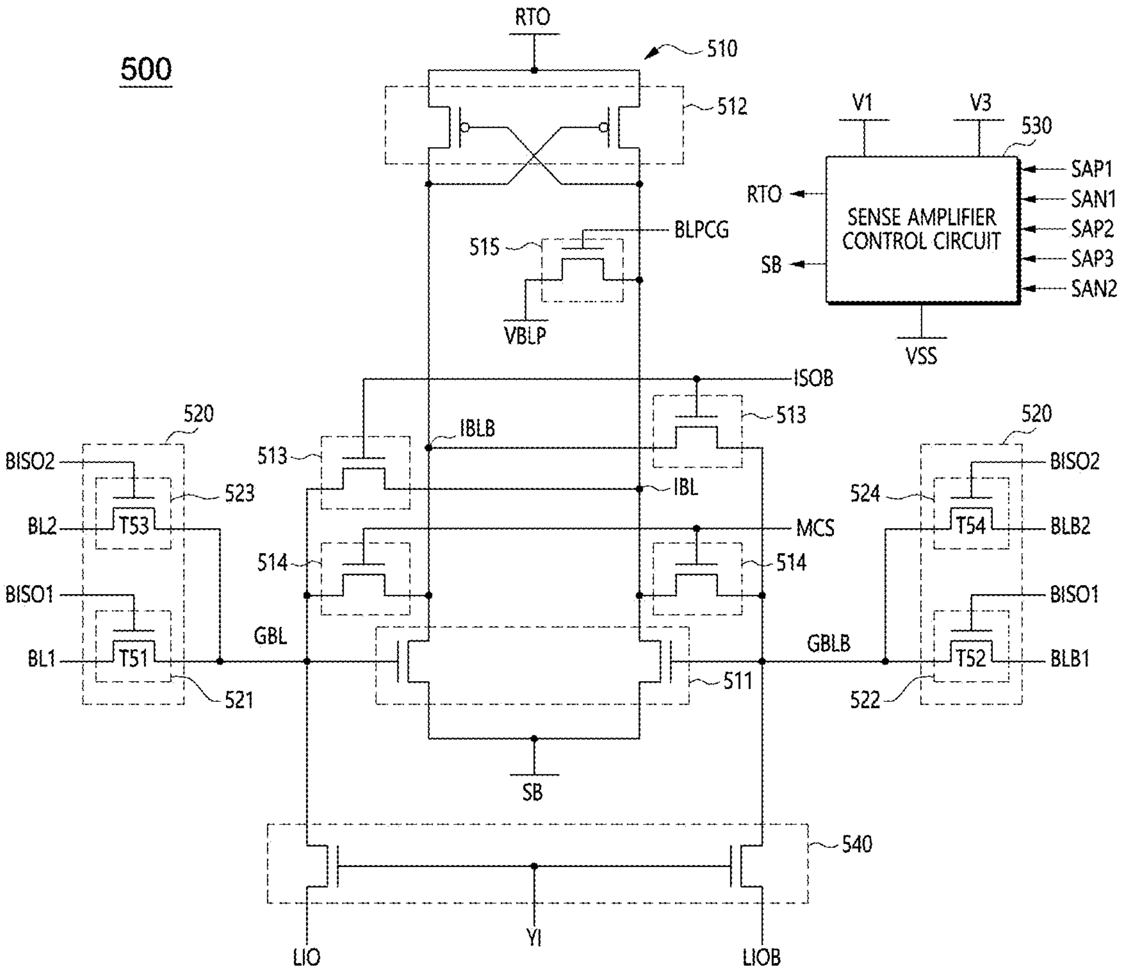
FIG. 9 is a diagram illustrating a configuration of a semiconductor memory apparatus according to an embodiment.

FIG. 9 is a diagram illustrating a configuration of a semiconductor memory apparatus 500 according to an embodiment. The semiconductor memory apparatus 500 may include configurations which are applied as connection relationship of the bitline sense amplifier BLSA and the first and second unit cell arrays MA1 and MA2 of the semiconductor memory apparatus 400 shown in FIG. 8. In an embodiment, the semiconductor memory apparatus 500 may include a bitline sense amplifier 510 and a bitline switching circuit 520. The bitline sense amplifier 510 may amplify and latch signals received through the global bitline GBL and the global bitline bar GBLB. The bitline sense amplifier 510 may change voltage levels of a first node IBLB and a second node IBL based on the signals received through the global bitline GBL and the global bitline bar GBLB. The bitline sense amplifier 510 may change the voltage level of the first node IBLB based on a voltage level of the global bitline GBL, and may change the voltage level of the second node IBL based on a voltage level of the global bitline bar GBLB.

The bitline switching circuit 520 may receive the first and second bitline switching signals BISO1, BISO2. The first and second bitline switching signals BISO1, BISO2 may be signals generated by the sub-wordline driver SWD shown in FIG. 8. Based on the first and second bitline switching signals BISO1, BISO2, the bitline switching circuit 520 may electrically couple one of the first bitline BL1 and the first bitline bar BLB1 or the second bitline BL2 and the second bitline bar BLB2 with the global bitline GBL and the global bitline bar GBLB. The bitline switching circuit 520 may electrically couple the first bitline BL1 and the first bitline bar BLB1 with the global bitline GBL and the global bitline bar GBLB, respectively, based on the first bitline switching signal BISO1. When the first bitline switching signal BISO1 is disabled, the bitline switching circuit 520 may electrically isolate the first bitline BL1 from the global bitline GBL and the first bitline bar BLB1 from the global bitline bar GBLB. When the first bitline switching signal BISO1 is enabled, the bitline switching circuit 520 may electrically couple the first bitline BL1 with the global bitline GBL and electrically couple the first bitline bar BLB1 with the global bitline bar GBLB. The bitline switching circuit 520 may electrically couple the second bitline BL2 and the second bitline bar BLB2 with the global bitline GBL and the global bitline bar GBLB, respectively, based on the second bitline switching signal BISO2. When the second bitline switching signal BISO2 is disabled, the bitline switching circuit 520 may electrically isolate the second bitline BL2 from the global bitline GBL and the second bitline bar BLB2 from the global bitline bar GBLB. When the second bitline switching signal BISO2 is enabled, the bitline switching circuit 520 may electrically couple the second bitline BL2 with the global bitline GBL and electrically couple the second bitline bar BLB2 with the global bitline bar GBLB.

The semiconductor memory apparatus 500 may further include a sense amplifier control circuit 530 and a column switch 540. The sense amplifier control circuit 530 and the column switch 540 may have substantially the same configuration as the sense amplifier control circuit 330 and the column switch 340 shown in FIG. 3. Duplicative descriptions of the same elements will be omitted. The bitline sense amplifier 510 may include an input circuit 511, a latch circuit 512, an isolation switching circuit 513, and a compensation switching circuit 514. The bitline sense amplifier 510 may further include a bitline precharge circuit 515. The bitline sense amplifier 510 may have substantially the same configuration as the bitline sense amplifier 310 illustrated in FIG. 3, except that the first input node IN1 is replaced by the global bitline GBL and the second input node IN2 is replaced by the global bitline bar GBLB. Duplicative descriptions of the same elements will be omitted.

The bitline switching circuit 520 may include a first switch 521, a second switch 522, a third switch 523, and a fourth switch 524. The first switch 521 may receive the first bitline switching signal BISO1, and may electrically couple the first bitline BL1 with the global bitline GBL based on the first bitline switching signal BISO1. The first switch 521 may include a first transistor T51. The first transistor T51 may be an N-channel MOS transistor. A gate of the first transistor T51 may receive the first bitline switching signal BISO1, one of a drain and a source of the first transistor T51 may be connected with the first bitline BL1, and the other of the drain and the source of the first transistor T51 may be connected with the global bitline GBL. The second switch 522 may receive the first bitline switching signal BISO1, and may connect the first bitline bar BLB1 with the global bitline bar GBLB based on the first bitline switching signal BISO1. The second switch 522 may include a second transistor T52. The second transistor T52 may be an N-channel MOS transistor. A gate of the second transistor T52 may receive the first bitline switching signal BISO1, one of a drain and a source of the second transistor T52 may be connected with the first bitline bar BLB1, and the other of the drain and the source of the second transistor T52 may be connected with the global bitline bar GBLB. The third switch 523 may receive the second bitline switching signal BISO2, and may connect the second bitline BL2 with the global bitline GBL based on the second bitline switching signal BISO2. The third switch 523 may include a third transistor T53. The third transistor T53 may be an N-channel MOS transistor. A gate of the third transistor T53 may receive the second bitline switching signal BISO2, one of a drain and a source of the third transistor T53 may be connected with the second bitline BL2, and the other of the drain and the source of the third transistor T53 may be connected with the global bitline GBL. The fourth switch 524 may receive the second bitline switching signal BISO2, and may connect the second bitline bar BLB2 with the global bitline bar GBLB based on the second bitline switching signal BISO2. The fourth switch 524 may include a fourth transistor T54. The fourth transistor T54 may be an N-channel MOS transistor. A gate of the fourth transistor T54 may receive the second bitline switching signal BISO2, one of a drain and a source of the fourth transistor T54 may be connected with the second bitline bar BLB2, and the other of the drain and the source of the fourth transistor T54 may be connected with the global bitline bar GBLB.

Figure 10:
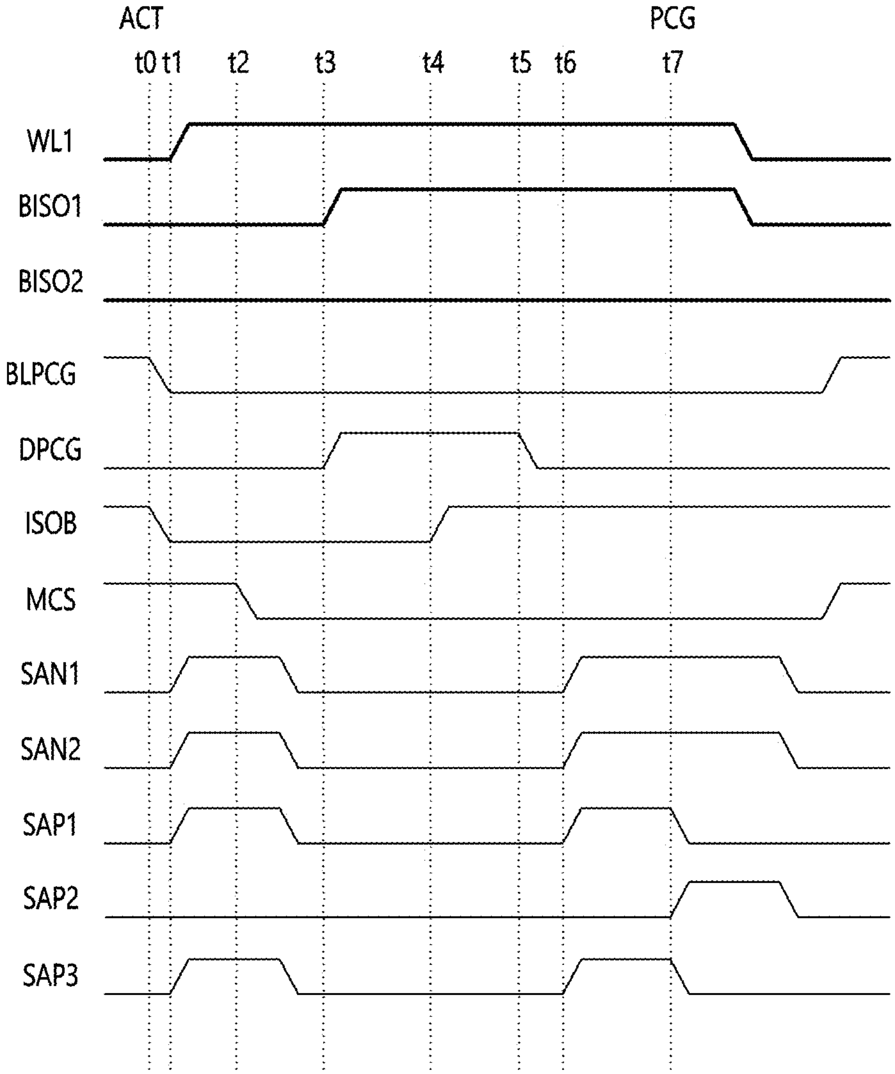
FIG. 10 is a timing diagram illustrating an operation of a semiconductor memory apparatus according to an embodiment.

FIG. 10 is a timing diagram illustrating an operation of the semiconductor memory apparatus 500 according to an embodiment. Referring to FIG. 1, FIGS. 8 to 10, a method of operation of the semiconductor memory apparatus 500 according to an embodiment will be described as follows. Before t0, the bitline precharge signal BLPCG, the isolation switching signal ISOB, and the mismatch compensation signal MCS may be enabled. The first and second bitline switching signals BISO1, BISO2 may remain disabled. Accordingly, the first node IBLB, the second node IBL, the global bitline GBL, and the global bitline bar GBLB may be precharged with the bitline precharge voltage VBLP. At t0, when the active signal ACT is received, the bitline precharge signal BLPCG and the isolation switching signal ISOB may be disabled, the global bitline GBL and the second node IBL may be electrically isolated, and the global bitline bar GBLB and the first node IBLB may be electrically isolated. Because the mismatch compensation signal MCS remains enabled, the electrically coupling between the global bitline GBL and the first node IBLB and the electrically coupling between the global bitline bar GBLB and the second node IBL may be maintained. At t1, the first control signal SAP1, the second control signal SAN1, the fourth control signal SAP3, and the fifth control signal SAN2 are enabled, and the sense amplifier control circuit 530 may provide the first internal voltage V1 to the first power terminal RTO and electrically couple the second power terminal SB with the ground voltage VSS. With power supplied to the first and second power terminals RTO, SB of the bitline sense amplifier 510, the bitline sense amplifier 510 is activated, and the bitline sense amplifier 510 may perform a mismatch compensation operation. Depending on a threshold voltage mismatch or offset between transistors of the input circuit 511 and a threshold voltage mismatch or offset between transistors of the latch circuit 512, the voltage levels of the first input node IN1 and the second input node IN2 may be set differently. Further, a wordline may be enabled at t1. For example, suppose the first wordline WL1 is enabled. As the first wordline WL1 is enabled, the first bitline BL1 may be electrically coupled with a memory cell, and charge sharing between the first bitline BL1 and the memory cell may be performed. When the data stored in the memory cell is 1, the voltage level of the first bitline BL1 may be slightly higher than the voltage level of the bitline precharge voltage VBLP. When the data stored in the memory cell is 0, the voltage level of the first bitline BL1 may be slightly lower than the voltage level of the bitline precharge voltage VBLP.

At t2, the mismatch compensation signal MCS may be disabled, the global bitline GBL and the first node IBLB may be electrically isolated, and the global bitline bar GBLB and the second node IBL may be electrically isolated. After the mismatch compensation signal MCS is disabled, the first, second, fourth, and fifth control signals SAP1, SAN1, SAP3, SAN2 may be disabled. At t3, the first bitline switching signal BISO1 may be enabled. The second bitline switching signal BISO2 may remain disabled. When the first bitline switching signal BISO1 is enabled, the first switch 521 may electrically couple the global bitline GBL with the first bitline BL1, and the second switch 522 may electrically couple the global bitline bar GBLB with the first bitline bar BLB1. Accordingly, the voltage level of the global bitline GBL may be changed in accordance with the voltage level of the first bitline bar BL1, and the voltage level of the global bitline bar GBLB may be changed in accordance with the voltage level of the first bitline bar BLB1. At t3, the driver precharge signal DPCG may be enabled and the sense amplifier control circuit 530 may disable the bitline sense amplifier 510 by setting the first and second power terminals RTO, SB to a voltage level of the bitline precharge voltage VBLP. At t4, the isolation switching signal ISOB may be enabled. When the isolation switching signal ISOB is enabled, the global bitline GBL may be electrically coupled with the second node IBL, and the global bitline bar GBLB may be electrically coupled with the first node IBLB. At t5, the driver precharge signal DPCG may be disabled, and after the driver precharge signal DPCG is disabled, the first, second, fourth, and fifth control signals SAP1, SAN1, SAP3, SAN2 may be enabled. The bitline sense amplifier 510 is enabled when the first internal voltage V1 is supplied to the first power terminal RTO and the second power terminal SB is electrically coupled to the ground voltage VSS. The bitline sense amplifier 510 may amplify the voltage levels of the global bitline GBL and the global bitline bar GBLB to develop the first and second nodes IBLB, IBL to logic levels opposite to each other. At t6, the first and fourth control signals SAP1, SAP3 may be disabled, the third control signal SAP2 may be enabled, and the voltage levels of the global bitline GBL, the global bitline bar GBLB, the first node IBLB, and the second node IBL may continue to be developed. When the data stored in the memory cell electrically coupled with the first bitline BL1 is 1, the bitline sense amplifier 510 may cause the voltage level of the first node IBLB to fall below the voltage level of the second node IBL in accordance with the voltage level of the global bitline GBL. Thus, the latch circuit 512 may drive the voltage level of the second node IBL to a high logic level, and may drive the voltage level of the first node IBLB to a low logic level.

When the precharge signal PCG is received at t7, the first wordline WL1 may be disabled, and the first bitline switching signal BISO1 may be disabled. Subsequently, the second, third, and fifth control signals SAN1, SAP2, SAN2 may be disabled. Further, as the bitline precharge signal BLPCG and the mismatch compensation signal MCS are enabled, the global bitline GBL, the global bitline bar GBLB, the first node IBLB, and the second node IBL may be precharged to the bitline precharge voltage VBLP.

Figure 11:
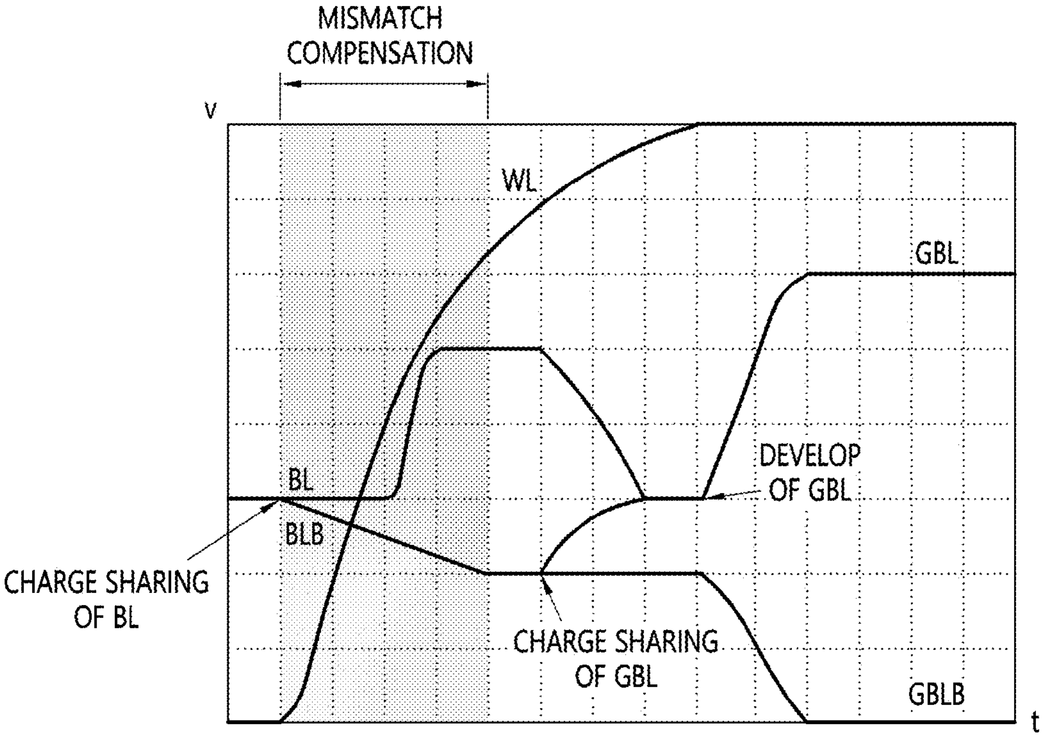
FIG. 11 is a timing diagram illustrating an operation of a semiconductor memory apparatus according to an embodiment.

FIG. 11 is a timing diagram illustrating an operation of a semiconductor memory apparatus according to an embodiment. In FIG. 11, a horizontal axis of the timing diagram may be a time t (for example, second) and a vertical axis may be a voltage level V. Referring to FIGS. 9 and 11, the semiconductor memory apparatus 500 may electrically isolate the bitline BL from the global bitline GBL. Thus, in an embodiment, the wordline WL may be enabled substantially simultaneously with the start of the mismatch compensation operation of the bitline sense amplifier 510. When the wordline WL is enabled, charge sharing of the bitline BL is performed, but because the bitline BL and the global bitline GBL are electrically isolated, the mismatch compensation operation can be performed normally regardless of change in a voltage level of the bitline BL. In an embodiment, when the mismatch compensation operation is completed, the semiconductor memory apparatus 500 may electrically couple the bitline BL and the global bitline GBL. Because the charge sharing of the bitline BL has already been completed, the voltage level of the global bitline GBL can be immediately changed according to the voltage level of the bitline BL, and the bitline sense amplifier 510 can develop a voltage level difference between the global bitline GBL and the global bitline bar GBLB. In an embodiment, by accelerating the timing at which the wordline WL is enabled, the timing at which the global bitline GBL and the global bitline bar GBLB are developed may be accelerated. Thus, in an embodiment, the timing at which the semiconductor memory apparatus 500 performs the read operation and the write operation may be accelerated, and one of the timing specifications of the semiconductor memory apparatus 500, tRCD (RAS to CAS delay), may be reduced, thereby improving the performance of the semiconductor memory apparatus 500.

A person skilled in the art to which the present disclosure pertains can understand that the present disclosure may be carried out in other specific forms without changing its technical spirit or essential features. Therefore, it should be understood that the embodiments described above are illustrative in all aspects, not limitative. The scope of the present disclosure is defined by the claims to be described below rather than the detailed description, and it should be construed that the meaning and scope of the claims and all changes or modified forms derived from the equivalent concept thereof are included in the scope of the present disclosure.

What is claimed is:

1. A semiconductor memory apparatus comprising:

a sub-wordline driver configured to receive a wordline control signal to enable a wordline coupled with a bitline, and configured to delay the wordline control signal to generate a bitline switching signal;

a bitline sense amplifier configured to change voltage levels of a first node and a second node based on signals received through a first input node and a second input node, and to electrically couple the first input node with the second node and the second input node with the first node, based on an isolation switching signal; and a bitline switching circuit configured to electrically couple the bitline with the first input node and a bitline bar with the second input node, in response to the bitline switching signal.

2. The semiconductor memory apparatus of claim 1, wherein the sub-wordline driver is configured to generate the bitline switching signal by delaying the wordline control signal by a time during which a mismatch compensation operation of the bitline sense amplifier is performed.

3. The semiconductor memory apparatus of claim 1, wherein the bitline sense amplifier comprises:
- an input circuit configured to change the voltage level of the first node based on the signal received through the first input node, and configured to change the voltage level of the second node based on the signal received through the second input node;
- a latch circuit configured to change the voltage levels of the first and second nodes based on the voltage levels of the first and second nodes;
- an isolation switching circuit configured to electrically couple the first input node with the second node and the second input node with the first node, based on the isolation switching signal; and
- a compensation switching circuit configured to electrically couple the first input node with the first node and the second input node with the second node, based on a mismatch compensation signal.

4. The semiconductor memory apparatus of claim 3, further comprising a bitline precharge circuit configured to precharge the second node to a bitline precharge voltage based on a bitline precharge signal.

5. The semiconductor memory apparatus of claim 1, wherein the bitline switching circuit comprises:
- a first switch that electrically couples the bitline to the first input node in response to the bitline switching signal; and
- a second switch that electrically couples the bitline bar to the second input node in response to the bitline switching signal.

6. An operating method of a semiconductor memory apparatus, the method comprising:
- electrically isolating a bitline from a first input node of a bitline sense amplifier, and electrically isolating a bitline bar from a second input node of the bitline sense amplifier;
- performing a mismatch compensation operation with the bitline sense amplifier, and enabling a wordline to electrically couple a memory cell to the bitline during performing the mismatch compensation operation;
- electrically coupling the first input node with the bitline, and electrically coupling the second input node with the bitline bar; and
- developing a voltage level difference of a first node and a second node by amplifying voltage levels of the first and second input nodes.

7. The method of claim 6, wherein the performing the mismatch compensation operation includes electrically coupling the first input node with the first node and electrically coupling the second input node with the second node.

8. The method of claim 6, further comprising, before enabling the wordline, precharging the second node.

9. The method of claim 6, further comprising, before the enabling of the wordline, electrically coupling the bitline with the first input node and electrically coupling the bitline bar with the second input node for a predetermined time.

10. The method of claim 6, further comprising, after the electrically coupling of the first input node with the bitline and the electrically coupling of the second input node with the bitline bar, electrically coupling the first input node with the second node, and electrically coupling the second input node with the first node.

11. A semiconductor memory apparatus comprising:
- a sub-wordline driver configured to receive a wordline control signal and enable one of a first wordline coupled with a first bitline and a second wordline coupled with a second bitline based on the wordline control signal, and configured to delay the wordline control signal to generate one of a first bitline switching signal and a second bitline switching signal;
- a bitline sense amplifier configured to amplify and latch voltage levels of a global bitline and a global bitline bar; and
- a bitline switching circuit configured to electrically couple the first bitline and a first bitline bar with the global bitline and the global bitline bar, respectively, in response to the first bitline switching signal, and configured to electrically couple the second bitline and a second bitline bar with the global bitline and the global bitline bar, respectively, in response to the second bitline switching signal.

12. The semiconductor memory apparatus of claim 11, wherein the sub-wordline driver is configured to generate the first and second bitline switching signals by delaying the wordline control signal by a time during which a mismatch compensation operation of the bitline sense amplifier is performed.

13. The semiconductor memory apparatus of claim 11, wherein the bitline sense amplifier comprises:
- an input circuit configured to change a voltage level of a first node based on the voltage level of the global bitline, and configured to change a voltage level of a second node based on the voltage level of the global bitline bar;
- a latch circuit configured to change the voltage levels of the first and second nodes based on the voltage levels of the first and second nodes;
- an isolation switching circuit configured to electrically couple the global bitline with the second node and the global bitline bar with the first node, based on an isolation switching signal; and
- a compensation switching circuit configured to electrically couple the global bitline with the first node and the global bitline bar with the second node, based on a mismatch compensation signal.

14. The semiconductor memory apparatus of claim 13, further comprising a bitline precharge circuit configured to precharge the second node to a bitline precharge voltage based on a bitline precharge signal.

15. The semiconductor memory apparatus of claim 11, wherein the bitline switching circuit comprises:
- a first switch that electrically couples the first bitline with the global bitline in response to the first bitline switching signal;
- a second switch that electrically couples the first bitline bar with the global bitline bar in response to the first bitline switching signal;
- a third switch that electrically couples the second bitline with the global bitline in response to the second bitline switching signal; and
- a fourth switch that electrically couples the second bitline bar with the global bitline bar in response to the second bitline switching signal.

16. An operating method of a semiconductor memory apparatus, the method comprising:
- electrically isolating first and second bitlines from a global bitline and electrically isolating first and second bitline bars from a global bitline bar;

performing a mismatch compensation operation with a bitline sense amplifier;

enabling one of first and second wordlines to electrically couple one of the first and second bitlines to a memory cell;

electrically coupling a bitline electrically coupled with an enabled wordline between the first and second bitlines with the global bitline; and developing a voltage level difference of a first node and a second node by amplifying voltage levels of the global bitline and the global bitline bar.

17. The method of claim 16, wherein the performing the mismatch compensation operation includes electrically coupling the global bitline with the first node and electrically coupling the global bitline bar with the second node.

18. The method of claim 16, further comprising, before the enabling the one of the first and second wordlines, precharging the second node.

19. The method of claim 16, further comprising, after the electrically coupling the global bitline with the bitline electrically coupled with the enabled wordline, electrically coupling the global bitline with the second node, and electrically coupling the global bitline bar with the first node.

* * * * *